(12) United States Patent
Kim et al.

(10) Patent No.: US 10,998,038 B2
(45) Date of Patent: May 4, 2021

(54) MEMORY DEVICE AND METHOD OF OPERATING THE SAME

(71) Applicant: SAMSUNG ELECTRONICS CO., LTD., Suwon-si (KR)

(72) Inventors: Jongryul Kim, Dangjin-si (KR); Taehui Na, Seoul (KR); Dueung Kim, Yongin-si (KR); Jongmin Baek, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/797,700

(22) Filed: Feb. 21, 2020

(65) Prior Publication Data

US 2021/0027829 A1     Jan. 28, 2021

(30) Foreign Application Priority Data

Jul. 25, 2019  (KR) .................. 10-2019-0090110

(51) Int. Cl.
*G11C 8/00* (2006.01)
*G11C 11/408* (2006.01)
(Continued)

(52) U.S. Cl.
CPC ...... *G11C 11/4087* (2013.01); *G11C 11/4074* (2013.01); *G11C 11/4085* (2013.01);
(Continued)

(58) Field of Classification Search
CPC ............ G11C 2213/71; G11C 13/0069; G11C 13/0004; G11C 13/004; G11C 2213/79; G11C 2213/76; G11C 2013/005; G11C 13/0064; G11C 16/0483; G11C 7/18; G11C 11/5678; G11C 13/0097; G11C 16/24; G11C 2013/0092; G11C 2213/51;
(Continued)

(56) References Cited

U.S. PATENT DOCUMENTS

| 7,180,787 B2 | 2/2007 | Hosono et al. |
| 9,123,410 B2 | 9/2015 | Castro et al. |

(Continued)

FOREIGN PATENT DOCUMENTS

JP   2013200930   10/2013

*Primary Examiner* — Thong Q Le
(74) *Attorney, Agent, or Firm* — F. Chau & Associates, LLC

(57) ABSTRACT

A memory device includes a plurality of memory cells each including a switching device and a storage device having a phase change material, a decoder circuit including a first bias circuit inputting a first bias voltage to a selected word line connected to a selected memory cell, a second bias circuit inputting a second bias voltage to a selected bit line, a first selection switching device and a first non-selection switching device connected between the first bias circuit and the selected word line, and a second selection switching device and a second non-selection switching device connected between an adjacent word line and the first bias circuit, a control logic sequentially turning off the first selection switching device and the second non-selection switching device, and a sense amplifier comparing a voltage of the selected word line with a reference voltage to determine data of a read operation.

32 Claims, 25 Drawing Sheets

(51) Int. Cl.
*G11C 11/56* (2006.01)
*G11C 11/4091* (2006.01)
*G11C 11/4074* (2006.01)
*G11C 11/4094* (2006.01)

(52) U.S. Cl.
CPC ...... *G11C 11/4091* (2013.01); *G11C 11/4094* (2013.01); *G11C 11/5678* (2013.01)

(58) Field of Classification Search
CPC .......... G11C 13/00; G11C 7/12; G11C 11/16; G11C 16/34; G11C 11/00; G11C 11/56; G11C 16/26; G11C 5/14; G11C 7/06; G11C 8/08; G11C 16/04; G11C 16/10; G11C 5/02; G11C 7/08; G11C 11/02; G11C 11/06; G11C 11/36
USPC .............................................................. 1/1
See application file for complete search history.

(56) References Cited

U.S. PATENT DOCUMENTS

| | | |
|---|---|---|
| 9,171,584 B2 | 10/2015 | Scheuerlein et al. |
| 9,183,932 B1 | 11/2015 | Kwon et al. |
| 9,293,208 B2 | 3/2016 | Yoo et al. |
| 9,384,832 B2 | 7/2016 | Kwon et al. |
| 9,837,164 B2 | 12/2017 | Yun |
| 10,115,464 B1 | 10/2018 | Lu et al. |
| 10,229,744 B2 | 3/2019 | Dutta et al. |
| 2015/0063021 A1 | 3/2015 | Castro et al. |
| 2016/0027477 A1 | 1/2016 | Petti |
| 2019/0115391 A1* | 4/2019 | Nardi .................... H01L 45/144 |

* cited by examiner

MEMORY DEVICE AND METHOD OF OPERATING THE SAME

CROSS-REFERENCE TO RELATED APPLICATION(S)

This U.S. non-provisional application claims the benefit of priority under 35 USC 119(a) to Korean Patent Application No. 10-2019-0090110 filed on Jul. 25, 2019 in the Korean Intellectual Property Office, the disclosure of which is incorporated by reference in its entirety herein.

BACKGROUND

1. Technical Field

The present inventive concept relates to a memory device and a method of operating the same.

Examples of resistive memory devices include phase-change random-access memories (PRAM), resistive random-access memories (ReRAM), and magnetic random-access memory devices (MRAM). Unlike memory devices that write data by charging or discharging charges, a resistive memory device may write or erase data by changing a resistance of its memory cells.

SUMMARY

At least one embodiment of the present inventive concept provides a memory device with an increased a sensing margin and an increased number of reading cycles.

According to an exemplary embodiment of the present inventive concept, a memory device includes a plurality of memory cells each including a switching device and a storage device connected to the switching device and having a phase change material, the plurality of memory cells being connected to a plurality of word lines and a plurality of bit lines, a decoder circuit including a first bias circuit configured to input a first bias voltage to a selected word line of the word lines connected to a selected memory cell of the plurality of memory cells during a read operation of the selected memory cell, a second bias circuit configured to input a second bias voltage to a selected bit line of the bit lines connected to the selected memory cell during the read operation, a first selection switching device and a first non-selection switching device connected between the first bias circuit and the selected word line, and a second selection switching device and a second non-selection switching device connected between an adjacent word line of the word lines adjacent to the selected word line and the first bias circuit, control logic configured to sequentially turn off the first selection switching device and the second non-selection switching device while the second bias voltage is input to the selected bit line, and a sense amplifier configured to compare a voltage of the selected word line with a reference voltage to determine read data of the read operation.

According to an exemplary embodiment of the present inventive concept, a memory device includes a memory cell array including a plurality of memory cells respectively disposed at intersections of a plurality of word lines and a plurality of bit lines, a first decoder circuit configured to determine a selected word line of the word lines connected to a selected memory cell of the plurality of memory cells, the first decoder circuit including a first bias circuit configured to input a first bias voltage to the selected word line during a first period of time, a second decoder circuit configured to determine a selected bit line of the bit lines connected to the selected memory cell, the second decoder circuit including a second bias circuit configured to input a second bias voltage to the selected bit line during a second period of time, after the first period of time, and control logic configured to float the selected word line and an adjacent word line of the word lines adjacent the selected word line, during the second period of time. A point in time at which the selected word line is floated and a point in time at which the adjacent word line is floated are different from each other during the second period of time.

According to an exemplary embodiment of the present inventive concept, a memory device includes a selected memory cell connected to a selected word line and a selected bit line, a first decoder circuit including a first bias circuit configured to input a first bias voltage to the selected word line during a first period of time, and a second decoder circuit including a second bias circuit configured to input a second bias voltage to the selected bit line during a second period of time, after the first period of time. For the second period of time, a period of time in which the selected word line is floated includes a period of time in which an adjacent word line adjacent the selected word line is floated, and the period of time in which the adjacent word line is floated is shorter than the period of time in which the selected word line is floated.

According to an exemplary embodiment of the present inventive concept, a method of operating a memory device includes inputting a first bias voltage to a selected word line connected to a selected memory cell during a first period of time, inputting a second bias voltage to a selected bit line connected to the selected memory cell during a second period of time, after the first period of time, floating the selected word line when the second period of time begins, and floating an adjacent word line adjacent to the selected word line when the second period of time starts and a predetermined delay time elapses.

According to an exemplary embodiment of the present inventive concept, a method of operating a memory device includes inputting a first bias voltage to a selected word line connected to a selected memory cell by a first bias circuit during a first period of time, inputting a second bias voltage to a selected bit line connected to the selected memory cell by a second bias circuit for a second period of time, after the first period of time, inputting a voltage for tuning a first selection switching device off to the first selection switching device connected between the first bias circuit and the selected word line when the second period of time begins, and inputting a voltage for turning off a second non-selection switching device to the second non-selection switching device connected between a ground power supply and an adjacent word line adjacent to the selected word line when the second period of time starts and a predetermined delay time elapses.

BRIEF DESCRIPTION OF DRAWINGS

The present inventive concept will be more clearly understood from the following detailed description, taken in conjunction with the accompanying drawings, in which.

DETAILED DESCRIPTION OF THE EXEMPLARY EMBODIMENTS

Hereinafter, exemplary embodiments of the present inventive concept will be described with reference to the accompanying drawings.

Figure 1:
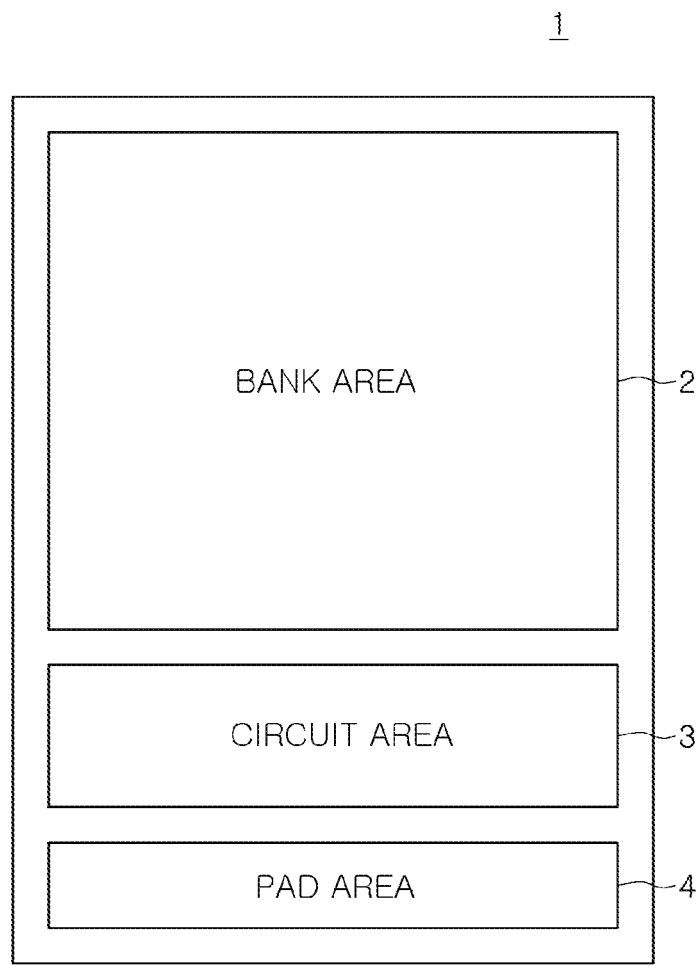
FIGS. 1 and 2 are schematic diagrams of a memory device according to an exemplary embodiment of the present inventive concept.
Figure 2:
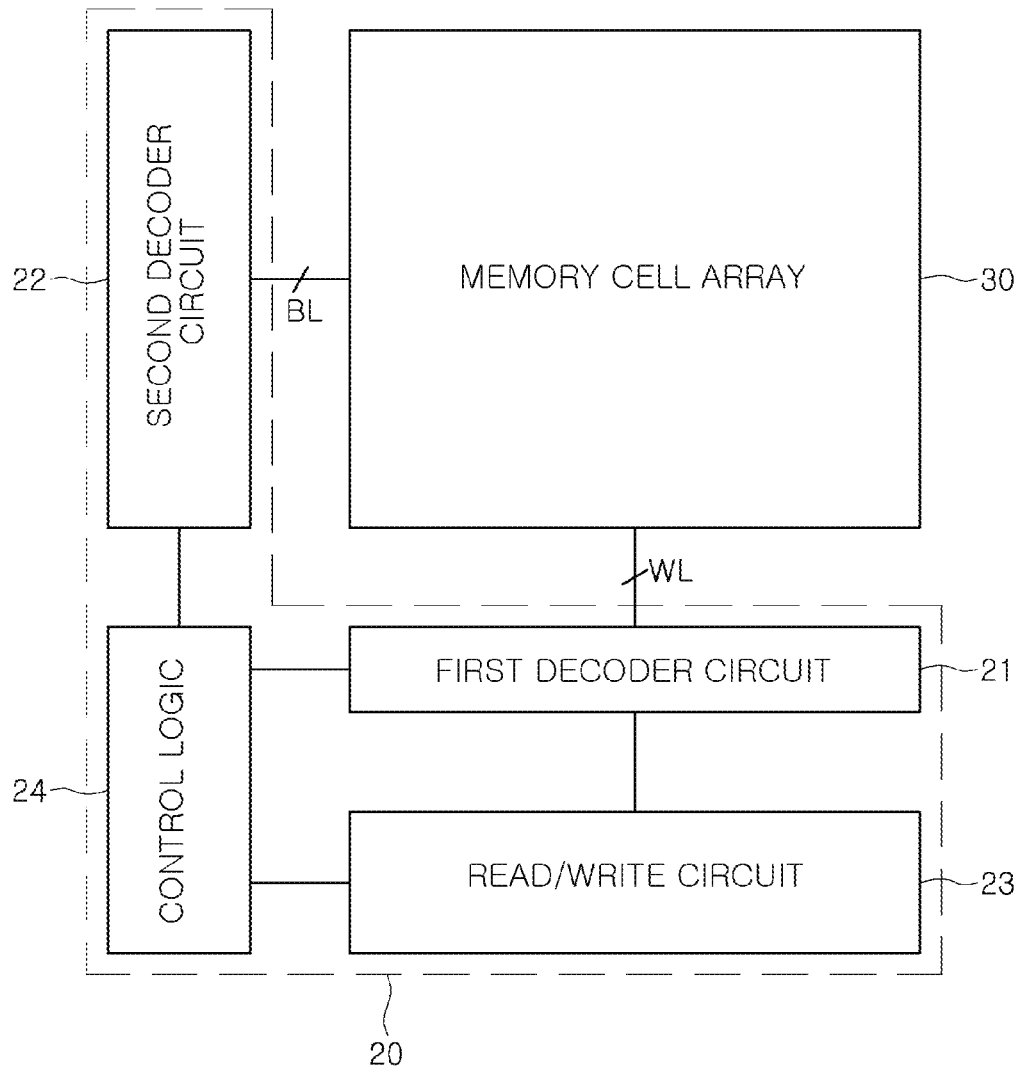

FIGS. 1 and 2 are schematic views illustrating a memory device according to an example embodiment.

Referring to FIG. 1, a memory device 1 according to an exemplary embodiment of the inventive concept includes a bank area 2, a circuit area 3, and a pad area 4. The pad area 4 may be an area in which a plurality of pads for inputting and outputting control signals and data are formed, and the circuit area 3 may be an area in which various circuits required for the operation of the memory device 1 are formed. Memory cell arrays having memory cells are formed in the bank area 2, and the memory cell arrays may be divided into a plurality of banks.

Each of the plurality of banks formed in the bank area 2 may be divided into a plurality of areas, but the inventive concept is not limited thereto as other arrangements are possible. For example, some of the areas may share a decoder circuit and/or a read/write circuit included in the circuit region 3.

The circuit area 3 may include a decoder circuit, a read/write circuit, and control logic controlling the decoder circuit and the read/write circuit. The decoder circuit may determine one or more of the memory cells located in the bank area 2 to access as a selected memory cell, and the read/write circuit may read data from or write data to the selected memory cell.

Next, referring to FIG. 2, a memory device 10 according to an exemplary embodiment of the inventive concept includes a memory controller 20 (e.g., a control circuit) and a memory cell array 30. The memory controller 20 includes decoder circuits 21 and 22, a read/write circuit 23, and control logic 24 (e.g., a logic circuit). The memory cell array 30 may include a plurality of memory cells. The decoder circuits 21 and 22 may include a first decoder circuit 21 connected to a plurality of memory cells through a word line WL (or multiple word lines), and a second decoder circuit 22 connected to a plurality of memory cells through a bit line BL (or multiple bit lines). Operations of the first decoder circuit 21, the second decoder circuit 22, and the read/write circuit 23 may be controlled by the control logic 24. In an exemplary embodiment, the read/write circuit 23 includes a program circuit writing data to at least one selected memory cell specified by the first decoder circuit 21 and the second decoder circuit 22, and a readout circuit reading data from the selected memory cell.

Figure 3A:
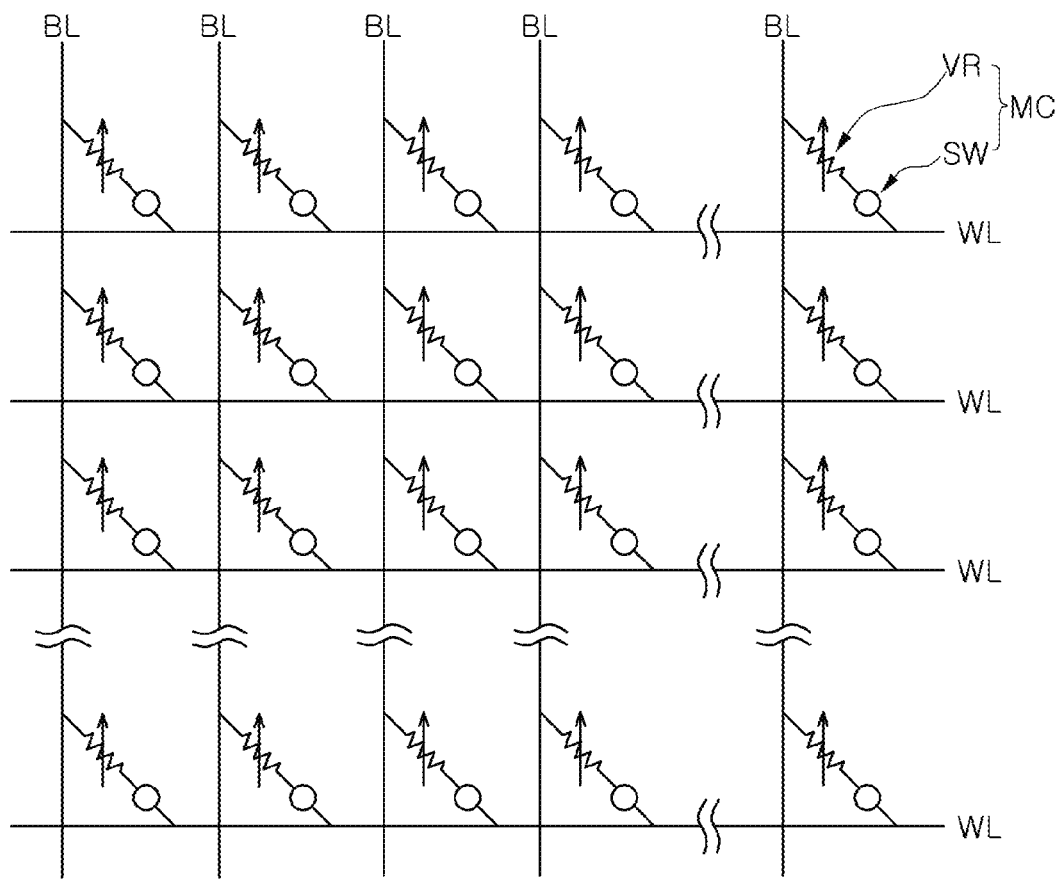
FIGS. 3A and 3B are exemplary schematic diagrams of memory cell arrays.
Figure 3B:
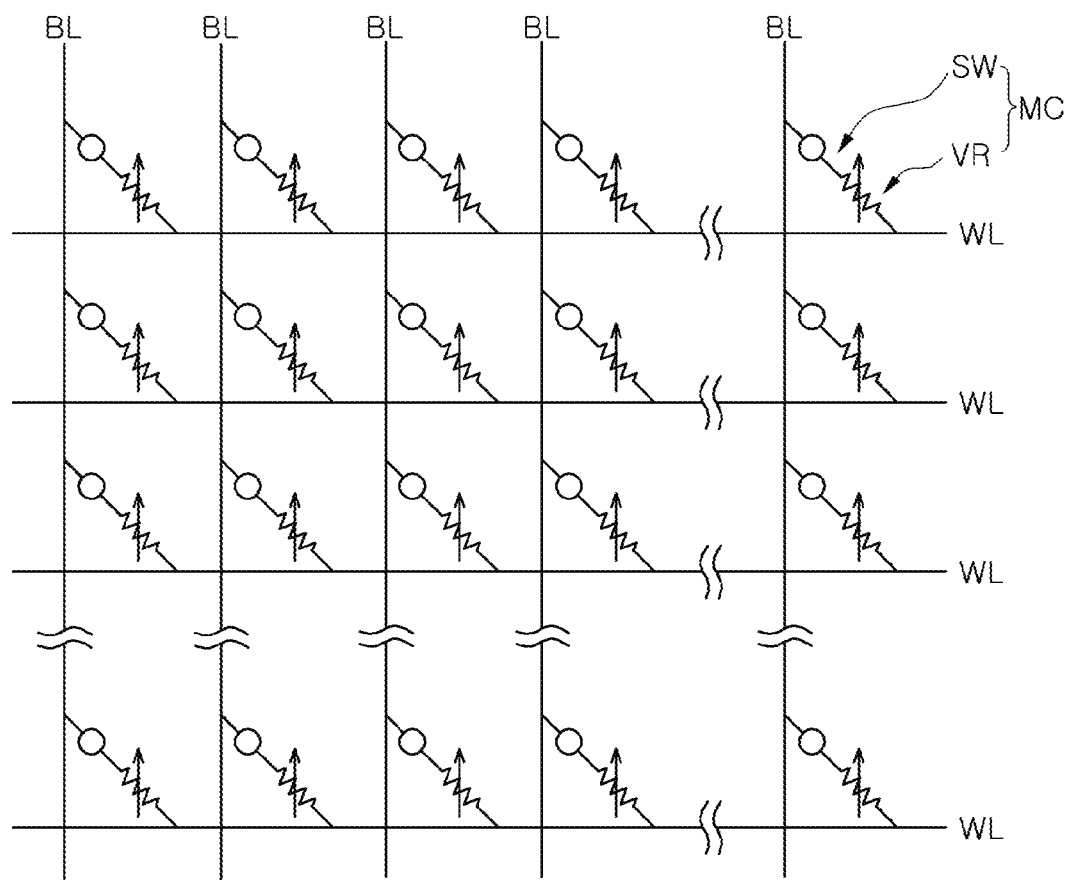

FIGS. 3A and 3B are exemplary schematic views of a memory cell array. Referring to FIGS. 2 and 3A, a memory cell array 30A according to an exemplary embodiment of the inventive concept includes a plurality of memory cells MC. The plurality of memory cells MC may be provided at a point at which the bit line BL and the word line WL intersect each other. For example, each of the plurality of memory cells MC may be connected to one bit line BL and one word line WL.

As an example, each of the plurality of memory cells MC may include a switching device SW and an information storage device VR. In an exemplary embodiment, the switching device SW includes at least one of a PN junction diode, a Schottky diode, and an ovonic threshold switch (OTS). In addition, in an exemplary embodiment, the information storage device VR is formed of a phase change material including a chalcogenide material. For example, the phase change material may have a super-lattice structure.

For example, the information storage device VR may include a phase change material having a phase that transitions between an amorphous phase and a crystalline phase depending on a heating time and temperature. The information storage device VR and the switching device SW may be connected to each other in series.

The memory controller 20 may record (e.g., write) or erase data by phase shifting a phase change material of the information storage device VR included in each of the plurality of memory cells MC to an amorphous phase or a crystalline phase by applying signals through the bit line BL and the word line WL. In an exemplary embodiment, the memory controller 20 increases a resistance of the information storage device VR by phase shifting the phase change material of the information storage device VR included in the memory cell MC to an amorphous phase. In an exemplary embodiment, the memory controller 20 reduces a resistance of the information storage device VR by phase shifting the phase change material of the information storage device VR included in the memory cell MC to a crystalline phase. The relationship between a resistance value of the information storage device VR and whether data is recorded may be variously defined according to exemplary embodiments of the inventive concept. The memory controller 20 may execute a read operation of reading data from the plurality of memory cells MC by comparing a read voltage detected from the plurality of memory cells MC with a predetermined reference voltage. The read voltage of a memory cell may indicate a resistance value of the memory cell.

Referring to FIG. 3A, in each of the plurality of memory cells MC, one end of the information storage device VR is connected to a bit line BL and one end of the switching device SW is connected to a word line WL. In this case, each of the plurality of memory cells MC illustrated in FIG. 3A may have a first direction.

FIG. 3B will be described based on the differences in comparison with FIG. 3A. Referring to FIG. 3B, one end of the information storage device VR is connected to a word line WL and one end of the switching device SW is connected to a bit line BL, in each of the plurality of memory cells MC. In this case, each of the plurality of memory cells MC illustrated in FIG. 3B may have a second direction.

The memory cell array 30 according to the exemplary embodiment illustrated in FIG. 2 may include a plurality of memory cells formed on different layers. For example, the memory cell array 30 may include a first layer and a second layer stacked on each other, where the memory cells included in the first layer have a first direction, and the memory cells included in the second layer have a second direction. However, the inventive concept is not limited thereto as the direction of memory cells included in the respective first and second layers may be variously modified.

According to an exemplary embodiment of the inventive concept, a first memory cell having the first direction is connected to a first word line, and a second memory cell having the second direction is connected to a second word line. According to an exemplary embodiment of the inventive concept, a point in time at which a first adjacent word line adjacent to the first word line is floated after a point in time at which a bit line precharging period for the first memory cell is started, and a point in time at which a second adjacent word line adjacent to the second word line is floated after a point in time at which a bit line precharging period for the second memory cell is started, are different from each other.

Figure 4A:
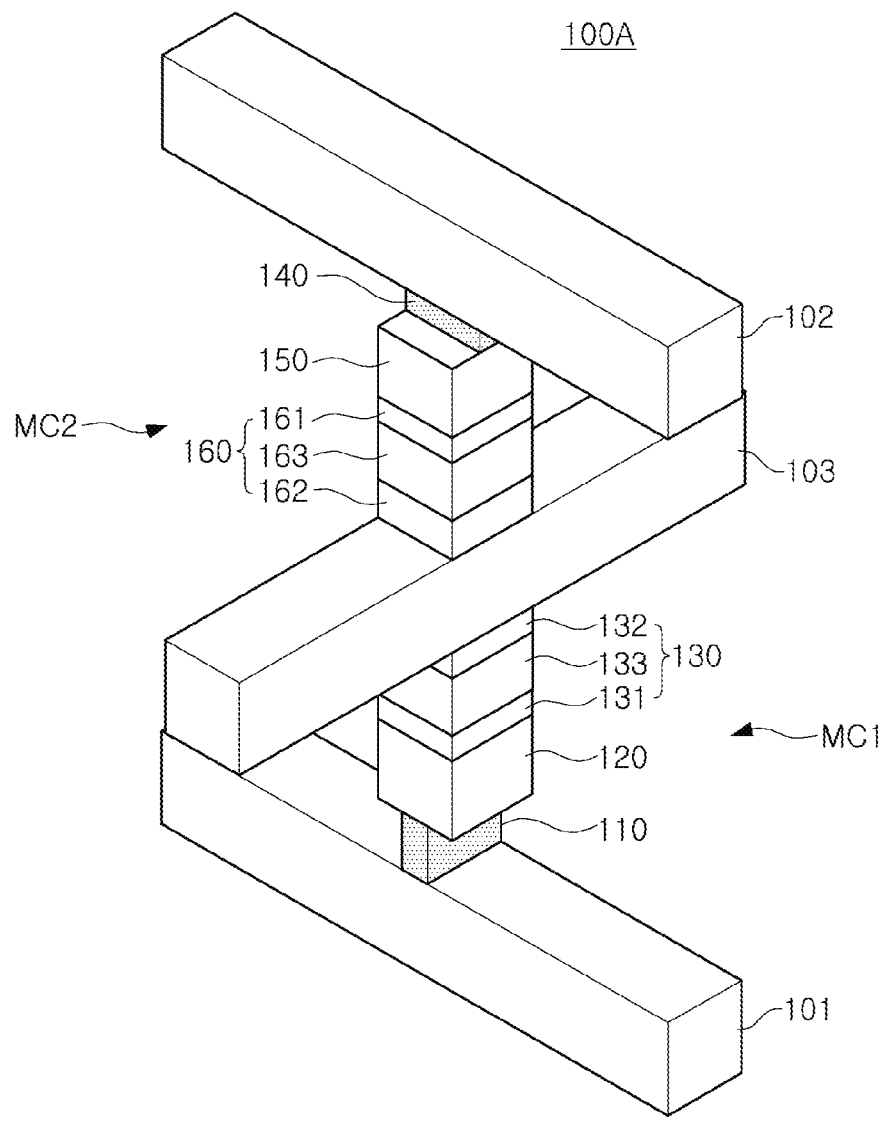
FIGS. 4A and 4B are views schematically illustrating structures of memory cells included in a memory device according to exemplary embodiments of the inventive concept.
Figure 4B:
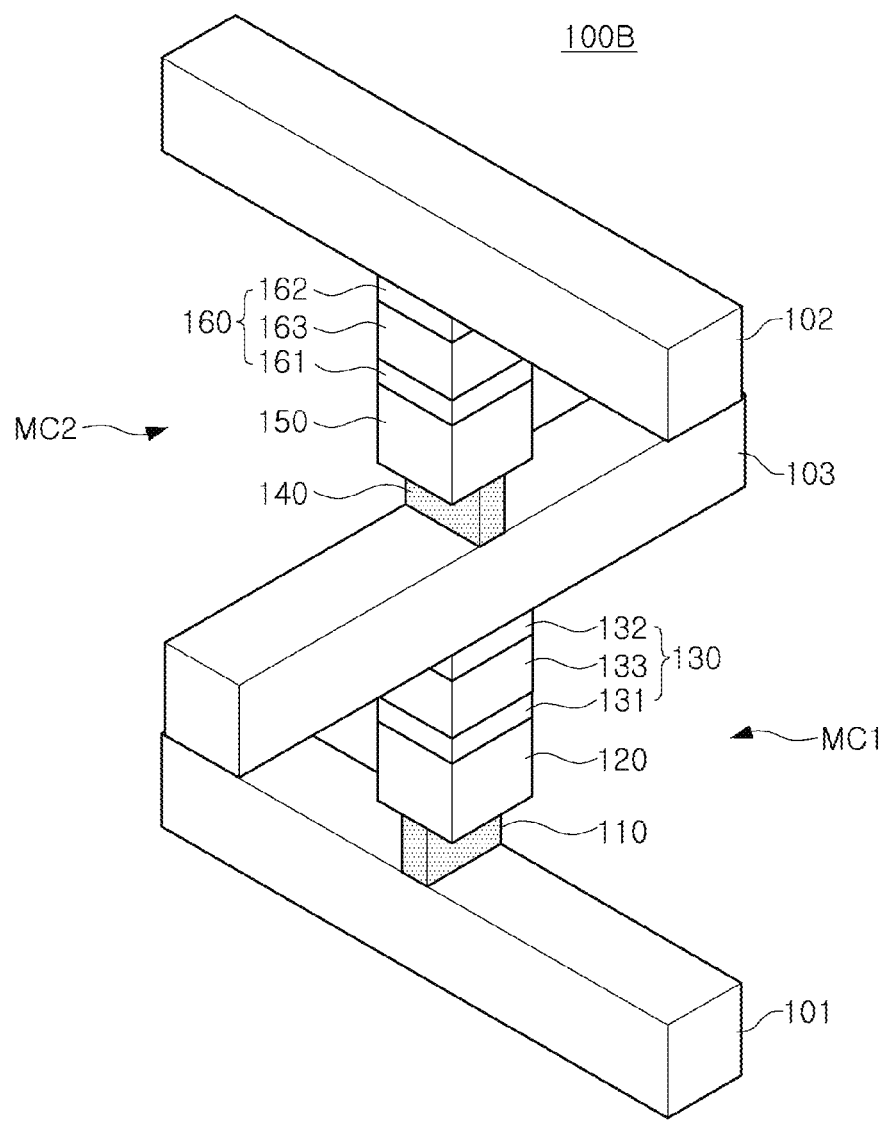

FIGS. 4A and 4B are views illustrating structures of memory cells included in memory devices according to exemplary embodiments of the inventive concept.

Referring to FIG. 4A, a memory device 100A according to an exemplary embodiment of the inventive concept includes a first memory cell MC1 and a second memory cell MC2 provided between a plurality of conductive lines 101 to 103. The first memory cell MC1 and the second memory cell MC2 may operate as independent memory cells, respectively. As an example, when the first conductive line 101 and the second conductive line 102 are word lines, the third conductive line 103 is a bit line. In another example, when the first conductive line 101 and the second conductive line 102 are bit lines, the third conductive line 103 is a word line. Hereinafter, for convenience of description, it will be assumed that the first conductive line 101 and the second conductive line 102 are the first word line and the second word line, respectively.

The first memory cell MC1 includes a first heating electrode 110, a first information storage device 120, and a first switching device 130. The first switching device 130 includes a first switch electrode 131, a second switch electrode 132, and a first selection layer 133 disposed therebetween. In an exemplary embodiment, the first selection layer 133 includes an Ovonic Threshold Switch (OTS) material. For example, an OTS material may include an amorphous chalcogenide-based compound. When a voltage higher than a threshold voltage is applied between the first switch electrode 131 and the second switch electrode 132, current may flow through the first selection layer 133.

The first information storage device 120 may include a phase change material such as a chalcogenide material. As an example, the first information storage device 120 may include Ge—Sb—Te (GST). A crystallization temperature, a melting point, and a phase transition rate according to crystallization energy of the first information storage device 120 may be determined depending on the type and chemical composition ratio of elements included in the first information storage device 120.

The second memory cell MC2 may have a structure similar to that of the first memory cell MC1. Referring to FIG. 4A, the second memory cell MC2 includes a second heating electrode 140, a second information storage device 150, and a second switching device 160. The structure and the characteristics of each of the second heating electrode 140, the second information storage device 150, and the second switching device 160 may be similar to those of the first heating electrode 110, the first information storage device 120, and the first switching device 130, respectively. Hereinafter, a method of writing and erasing data will be described with reference to the first memory cell MC1 as an example.

When a voltage is supplied through the first word line 101 and the bit line 103, Joule heat depending on the voltage may be generated at an interface between the first heating electrode 110 and the first information storage device 120. A phase change material constituting the first information storage device 120 may be changed from an amorphous phase to a crystalline phase or from a crystalline phase to an amorphous phase, by the Joule heat. In an exemplary embodiment, the first information storage device 120 has a high resistance in the amorphous phase and has a low resistance in the crystalline phase. In an example embodiment, data '0' (e.g., a first logic level) or '1' (e.g., a second other logic level) may be defined depending on a resistance value of the first information storage device 120. For example, the first information storage device 120 could represent a data '0' during the amorphous phase and represent data '1' during the crystalline phase.

To write data to the first memory cell MC1, a program voltage may be supplied through the first word line 101 and the bit line 103. When the program voltage is greater than a threshold voltage of an ovonic threshold switch material included in the first switching device 130, a current may flow through the first switching device 130. The phase change material included in the first information storage device 120 may change from an amorphous phase to a crystalline phase by the program voltage, and thus, data may be recorded in the first memory area. In an example embodiment, when the phase change material included in the first information storage device 120 has a crystalline phase, the state of the first memory cell MC1 is defined as a set state. For example, during the set state, the first memory cell MC1 may represent data '1'.

In an exemplary embodiment, to erase data written to the first memory cell MC1, the phase change material included in the first information storage device 120 is returned from the crystalline phase to the amorphous phase. For example, a predetermined erase voltage may be supplied through the first word line 101 and the bit line 103 to erase the written data. Due to the erase voltage, the phase change material included in the first information storage device 120 may change from the crystalline phase to the amorphous phase. In an exemplary embodiment when the phase change material included in the first information storage device 120 has an amorphous phase, the state of the first memory cell MC1 is defined as a reset state. For example, the memory cell CM1 having the reset state may represent data '0'. In an exemplary embodiment, a maximum value of the erase voltage is greater than a maximum value of the program voltage, and a period of time during which the erase voltage is supplied is shorter than a period of time during which the program voltage is supplied.

As described above, depending on the state of the phase change material included in the information storage devices 120 and 150, resistance values of the information storage devices 120 and 150 may be changed, and the memory controller may distinguish data '0' and '1' from resistance values of the information storage devices 120 and 150. Therefore, as a resistance difference between the information storage devices 120 and 150 generated depending on the state of the phase change material included in the information storage devices 120 and 150 increases, the memory controller may correctly read data stored in the memory cells MC1 and MC2.

FIG. 4B will be described based on the differences in comparison with FIG. 4A. Referring to FIGS. 4A and 4B, when the first conductive line 101 and the second conductive line 102 are a first word line and a second word line, respectively, the first memory cell MC1 and the second memory cell MC2 may have different directions. For example, referring to FIG. 4A, the first memory cell MC1 and the second memory cell MC2 may respectively have a first direction. In FIG. 4A, the second heating electrode 140 is disposed between the second conductive line 102 and the second information storage device 150. Referring to FIG. 4B, the first memory cell MC1 may have a second direction, and the second memory cell MC2 may have a first direction. In FIG. 4B, the second heating electrode 140 is disposed between the third conductive line 103 and the second information storage device 150.

Figure 5A:
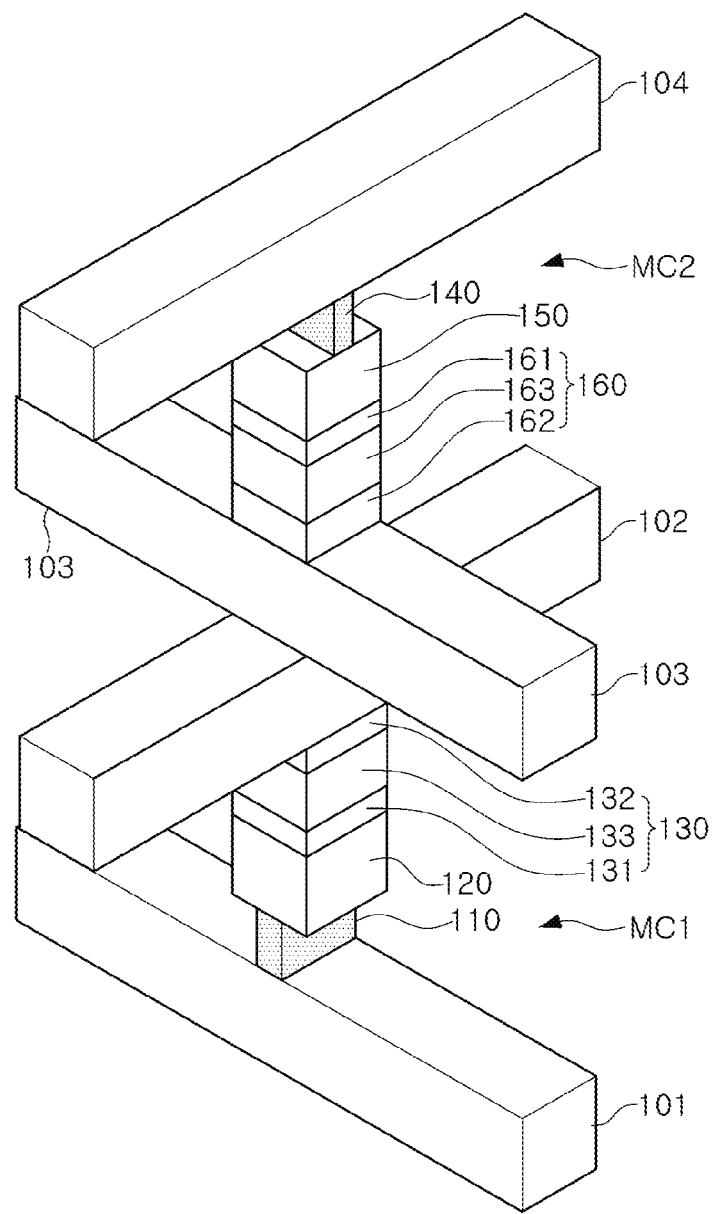
FIGS. 5A and 5B are diagrams schematically illustrating a structure of a memory cell included in a memory device according to an exemplary embodiment of the inventive concept.
Figure 5B:
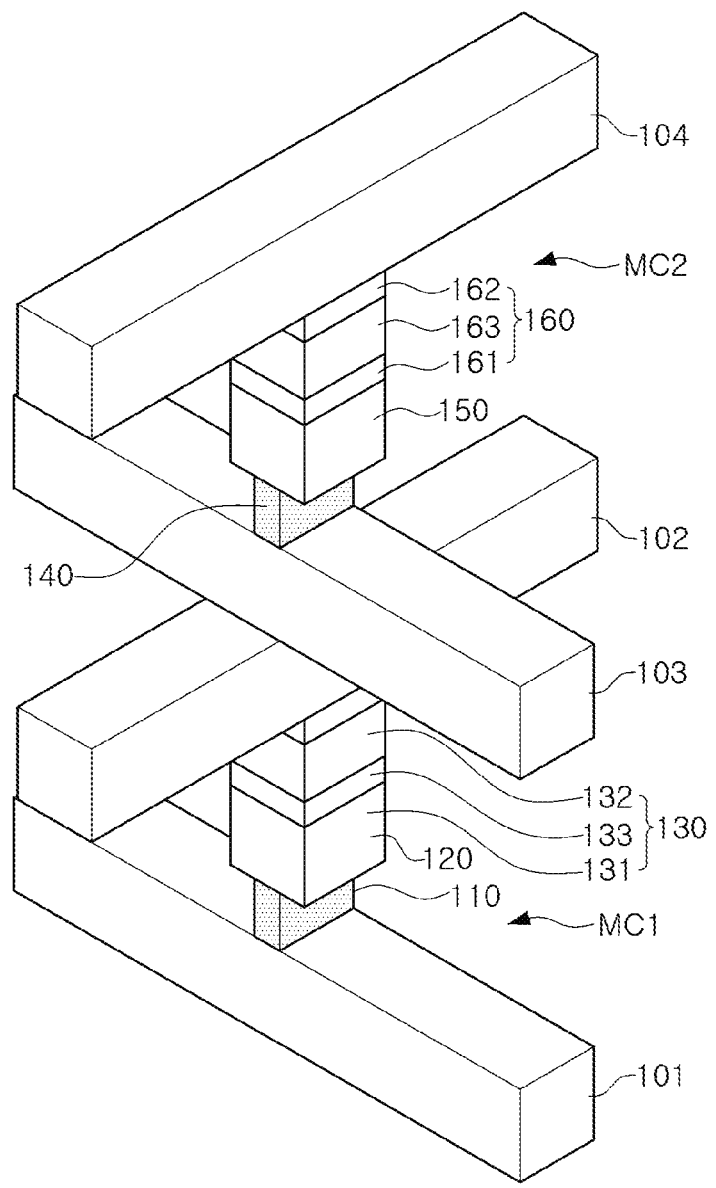

FIGS. 5A and 5B are schematic views illustrating a structure of a memory cell included in a memory device according to an exemplary embodiment of the inventive concept.

Structures and features of first and second memory cells MC1 and MC2 illustrated in FIGS. 5A and 5B may be similar to those of the first and second memory cells MC1 and MC2 of FIGS. 4A and 4B. In an exemplary embodiment, in FIGS. 5A and 5B, the first memory cell MC1 connected to a first word line formed on a first layer and the second memory cell MC2 connected to a second word line formed on a second layer do not share a bit line.

Referring to FIG. 5A, the first memory cell MC1 may be provided at a point at which a first word line 101 formed on the first layer and a first bit line 102 formed on the first layer intersect each other. The second memory cell MC2 may be provided at a point at which a second word line 103 formed on the second layer and a second bit line 104 formed on the second layer intersect each other. The first memory cell MC1 has a second direction, and the second memory cell MC2 has a first direction. In FIG. 5A, the second heating electrode 140 is disposed between the second bit line 104 and the second information storage device 150.

FIG. 5B will be described based on differences in comparison with FIG. 5A. Referring to FIG. 5B, the first memory cell MC1 and the second memory cell MC2 respectively have a second direction. In FIG. 5B, the second heating electrode 140 is disposed between the second word line 103 and the second information storage device 150.

Figure 6:
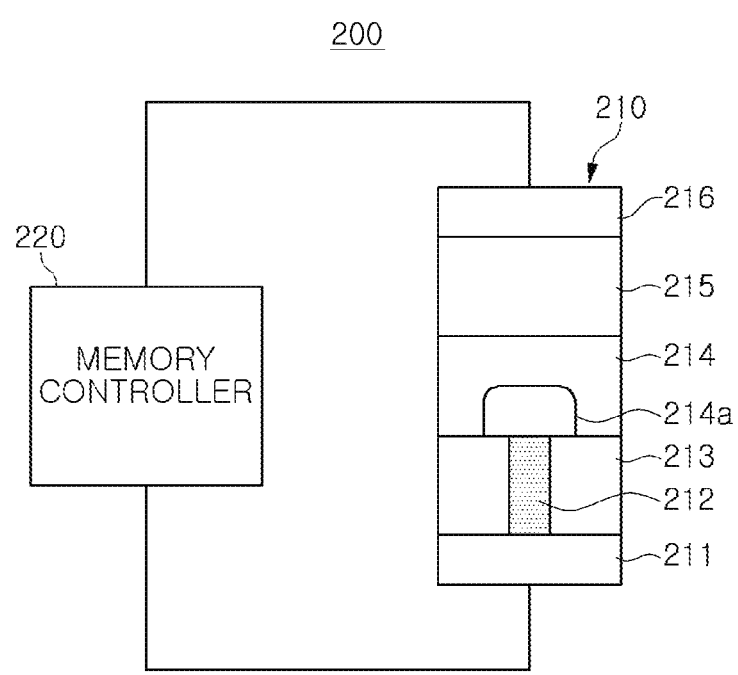
FIG. 6 is a diagram illustrating an operation of a memory device according to an exemplary embodiment of the inventive concept.

FIG. 6 is a diagram illustrating an operation of a memory device according to an exemplary embodiment of the inventive concept.

A memory device 200 according to an exemplary embodiment of the inventive concept operates by power supplied by a memory controller 220 to a memory cell 210. Referring to FIG. 6, the memory cell 210 includes a lower electrode 211, a heating electrode 212, an information storage device 214, a switching device 215, and an upper electrode 216. The lower electrode 211 and the upper electrode 216 may receive a voltage output by the memory controller 220 through a word line or a bit line. An insulating layer 213 may be provided around the heating electrode 212. For example, the insulating layer 213 may entirely surround the heating electrode 212. A phase change may occur in a partial region 214a of the information storage device 214 adjacent to the heating electrode 212, due to power supplied by the memory controller 220.

In an exemplary embodiment, a read operation for reading data of the memory cell 210 may be performed by inputting a predetermined bias voltage to each of the lower electrode 211 and the upper electrode 216. As an example, the memory controller 220 may input a first bias voltage having a relatively low voltage level to the lower electrode 211 and a second bias voltage having a relatively high voltage level to the upper electrode 216, to read data of the memory cell 210.

For example, the memory controller 220 may first input the first bias voltage to the lower electrode 211 and may then float the lower electrode 211 while inputting the second bias voltage to the upper electrode 216. Since the second bias voltage is input to the upper electrode 216 while the lower electrode 211 is floated, a current may flow in the memory cell 210. According to an exemplary embodiment, the memory controller 220 charges a capacitor with the current flowing in the memory cell 210, detects a voltage of the charged capacitor, and determines the data of the memory cell 210 by comparing the detected voltage with a reference voltage. In an exemplary embodiment, a switch is present between the memory controller 220 and the lower electrode 211, the switch is closed to input the first bias voltage to the lower electrode 211, and the switch is opened to float the lower electrode 211.

Figure 7:
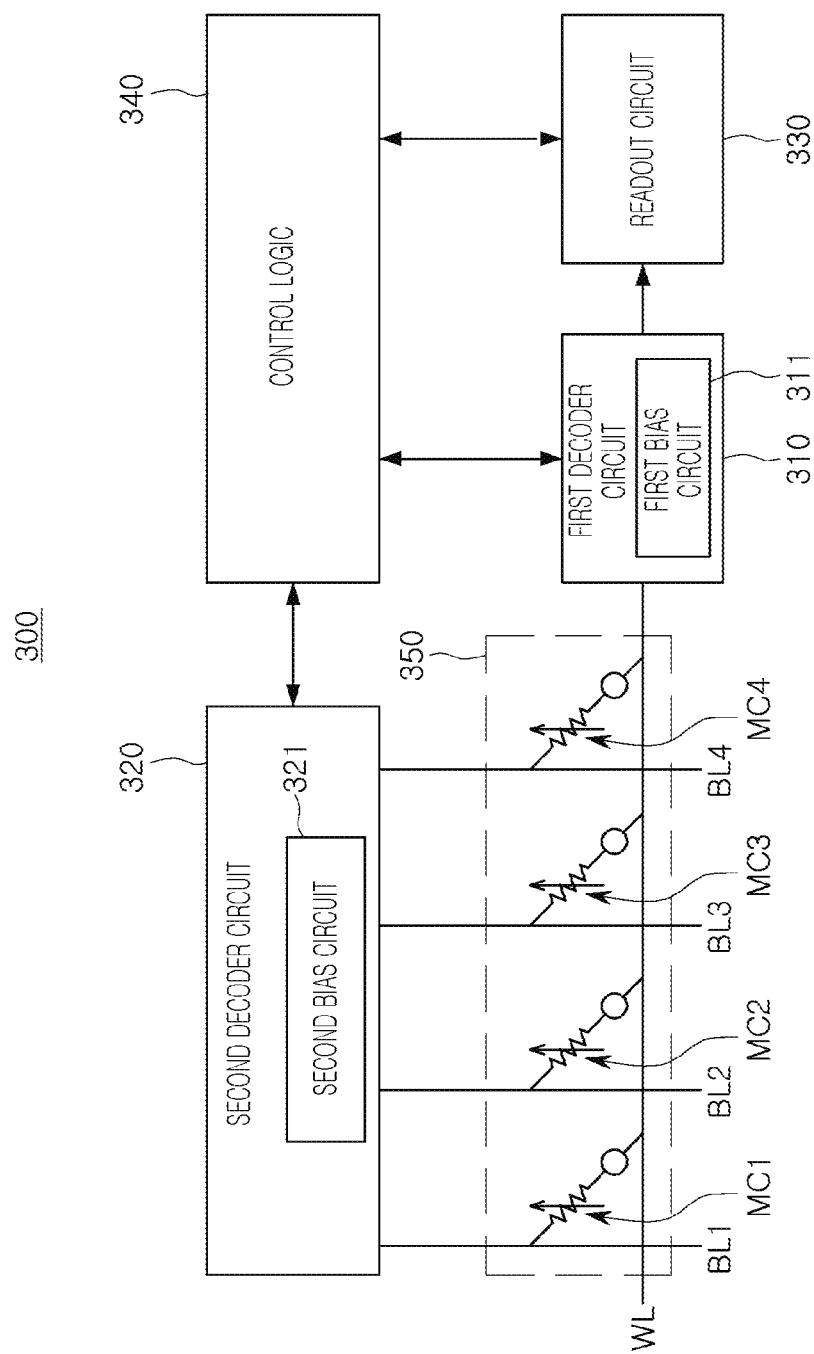
FIG. 7 is a diagram illustrating an operation of a memory device according to an exemplary embodiment of the inventive concept.

FIG. 7 is a diagram illustrating an operation of a memory device according to an exemplary embodiment of the inventive concept.

Referring to FIG. 7, a memory device 300 according to an exemplary embodiment of the inventive concept includes a first decoder circuit 310, a second decoder circuit 320, a readout circuit 330, control logic 340, and a memory cell array 350. The memory cell array 350 may include a plurality of memory cells MC1 to MC4. The first decoder circuit 310 may be connected to the plurality of memory cells MC1 to MC4 through a word line WL, and the second decoder circuit 320 may be connected to the plurality of memory cells MC1 to MC4 through first to fourth bit lines BL1 to BL4. For convenience of description, in FIG. 7, only one word line WL is illustrated, but the memory cell array 350 may include a plurality of word lines WL. In addition, the number of bit lines BL1 to BL4 and the number of memory cells MC1 to MC4 may also be variously modified.

In the exemplary embodiment illustrated in FIG. 7, the readout circuit 330 may read data of a selected memory cell selected from the memory cells MC1 to MC4. For example, when a fourth bit line BL4 is determined as a selected bit line, first to third bit lines BL1 to BL3 are unselected bit lines. The first decoder circuit 310 connects a first bias circuit 311 to the word line WL to input a first bias voltage, and the second decoder circuit 320 connects a second bias circuit 312 to the fourth bit line BL4 to input a second bias voltage. In an exemplary embodiment, the second bias voltage is greater than the first bias voltage.

In an exemplary embodiment, the second decoder circuit 320 inputs a third bias voltage that is greater than the first bias voltage and less than the second bias voltage to the unselected first to third bit lines BL1 to BL3. In an example, the third bias voltage may be a voltage of 0V, the first bias voltage may be a negative voltage, and the second bias voltage may be a positive voltage. In an exemplary embodiment, the absolute values of the first bias voltage and the second bias voltage are equal to each other. In an exemplary embodiment, the first to third bias voltages are applied during a same time period.

As described above, when the bias voltages are input to the bit lines BL1 to BL4 and the word line WL, current may flow only in the selected memory cell to which a relatively high voltage is input. The readout circuit 330 may determine a state of the selected memory cell as a set or reset state by detecting a read voltage corresponding to the current flowing in the selected memory cell and comparing the read voltage with a reference voltage. As an example, a capacitor included in the first decoder circuit 310 or the readout circuit 330 may be charged by the current flowing through the selected memory cell, and the readout circuit 330 may compare the voltage of the capacitor (e.g., the read voltage) with the reference voltage to determine data (e.g., a set or reset state) of the selected memory cell.

When the read operation is repeatedly performed, read disturb characteristics in which the selected memory cell in the set state is recognized as being in the reset state may appear. The maximum number of times that the read operation can be performed without causing the read disturb characteristics may be defined as the number of reading cycles or the maximum allowed number of reading cycles.

In an exemplary embodiment of the present inventive concept, a capacitance value between a selected word line to which a selected memory cell is connected and an adjacent word line adjacent to the selected word line (e.g., an unselected word line) may be reduced. As the capacitance value between the selected word line and the adjacent word line decreases, the read disturb margin may increase. Increasing the read disturb margin may increase the number of reading cycles. For example, increasing the read disturb margin may increase the number of reads that can be performed on a given memory cell before causing a read disturb of the given memory cell.

In an exemplary embodiment of the inventive concept, the adjacent word line is floated during the time when the selected bit line is precharged and the selected word line is floated. Therefore, the capacitance value between the selected word line and the adjacent word line may be reduced. In addition, in an exemplary embodiment of the inventive concept, a time point at which the selected word line is floated and a time point at which the adjacent word line is floated are controlled differently. In an exemplary embodiment, the time point at which the adjacent word line is floated is later than the time point at which the selected word line is floated. Therefore, a sensing margin of a memory cell having a relatively low threshold voltage may be prevented from decreasing.

FIGS. 8 to 12 are circuit diagrams provided to describe an operation of a memory device according to an exemplary embodiment of the inventive concept.

Figure 8:
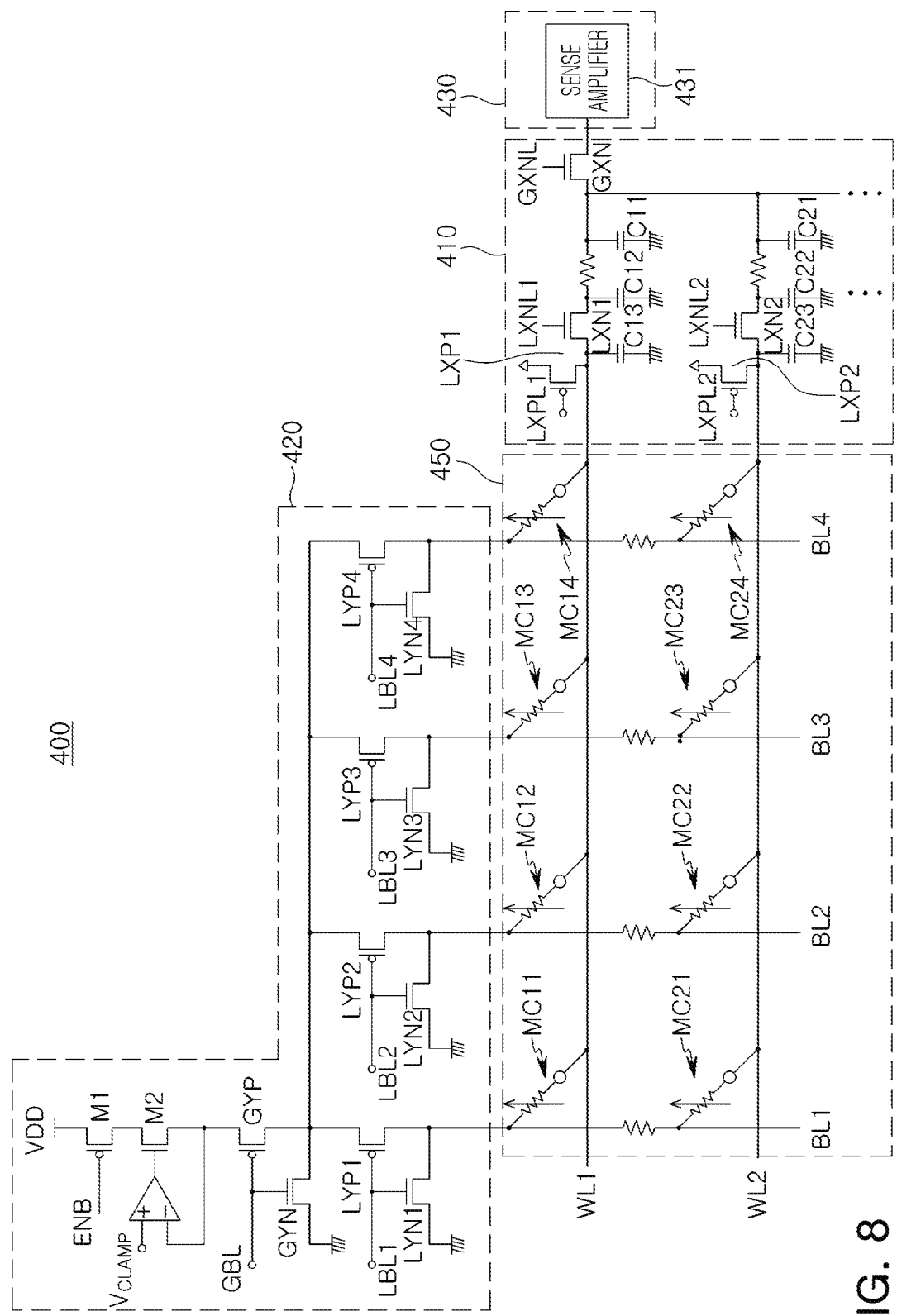
FIGS. 8 to 12 are circuit diagrams illustrating operations of a memory device according to an exemplary embodiment of the inventive concept.

Referring to FIG. 8, a memory device 400 according to an exemplary embodiment of the inventive concept includes a first decoder circuit 410, a second decoder circuit 420, a readout circuit 430, and a memory cell array 450. In the example embodiment of FIG. 8, only two word lines WL1 and WL2 and four bit lines BL1 to BL4 are illustrated, but the number thereof may be variously modified. The memory cell array 450 may include memory cells MC11 to MC14 and MC21 to MC24 connected to word lines WL1 and WL2 and bit lines BL1 to BL4.

The first decoder circuit 410 is connected to the word lines WL1 and WL2, and determines one of the word lines WL1 and WL2 as a selected word line and applies a first bias voltage to the selected word line for a read operation. The first decoder circuit 410 may determine the selected word line based on a read address associated with the read operation. The read address may be received from the memory controller 220 or from a host device external to the memory controller 220. In an example, the first bias voltage may be a negative voltage. A first bias circuit for inputting the first bias voltage may be connected between a common selection switching device GXN and a sense amplifier 431.

The first word line WL1 is connected to a first selection switching device LXN1 and a first non-selection switching device LXP1. The first selection switching device LXN1 is turned on when the first word line WL1 is determined as the selected word line, and the first non-selection switching device LXP1 is turned on when inputting a ground voltage to the first word line WL1. For example, the first selection switching device LXN1 may be an NMOS transistor, and the first non-selection switching device LXP1 may be a PMOS transistor. A gate terminal of the first selection switching device LXN1 receives a first word line selection control signal LXNL1. A gate terminal of the first non-selection switching device LXP1 receives a first word line non-selection control signal LXPL1.

The second word line WL2 is connected to a second selection switching device LXN2 and a second non-selection switching device LXP2. The second selection switching device LXN2 is turned on when the second word line WL2 is determined as a selected word line, and the second non-selection switching device LXP2 is turned on when inputting a ground voltage to the second word line WL2. For example, the second selection switching device LXN2 may be an NMOS transistor, and the second non-selection switching device LXP2 may be a PMOS transistor. A gate terminal of the second selection switching device LXN2 receives a second word line selection control signal LXNL2. A gate terminal of the second non-selection switching device LXP2 receives a second word line non-selection control signal LXPL2.

The word lines WL1 and WL2 may share one common selection switching device GXN. The common selection switching device GXN may be an NMOS transistor. A gate terminal of the common selection switching device GXN receives a common word line control signal GXNL.

In the exemplary embodiment illustrated in FIG. 8, the first word line WL1 and the second word line WL2 share one common selection switching device GXN and the sense amplifier 431. However, in some embodiments, the first word line WL1 and the second word line WL2 may be connected to different common selection switching devices GXN and the sense amplifier 431.

Each of the bit lines BL1 to BL4 may be connected to a pair of switching devices of the second decoder circuit 420. Referring to the first bit line BL1 as an example, the first bit line BL1 is connected to a first selection switching device LYP1 and a first non-selection switching device LYN1. The first selection switching device LYP1 is turned on when the first bit line BL1 is determined as a selected bit line, and the first non-selection switching device LYN1 is turned on when the first bit line BL1 is determined as a non-selected bit line. For example, the first selection switching device LYP1 may be a PMOS transistor, and the first non-selection switching device LYN1 may be an NMOS transistor. Gate terminals of the first selection switching device LYP1 and the first non-selection switching device LYN1 receive a first bit line control signal LBL1 in common.

The bit lines BL1 to BL4 share one common selection switching device GYP and a common non-selection switching device GYN. The common selection switching device GYP may be a PMOS transistor, and the common non-selection switching device GYN may be an NMOS transistor. Gate terminals of the common selection switching device GYP and the common non-selection switching device GYN receive a common bit line control signal GBL in common.

The sense amplifier 431 may include a capacitor and compare the voltage of the capacitor with a predetermined reference voltage. For example, the sense amplifier 431 may be implemented as an operational amplifier. A first input terminal of the operational amplifier may be connected to the capacitor and the word lines WL1 and WL2, and a second input terminal of the operational amplifier may be connected to the reference voltage source.

In an exemplary embodiment, the word lines WL1 and WL2 are connected to a selected global word line, and the bit lines BL1 to BL4 are connected to a selected global bit line. In an exemplary embodiment, the capacitance of the selected global word line is lower than the capacitance of the selected global bit line while precharging the selected bit line among the bit lines BL1 to BL4. In an exemplary embodiment, the selected global word line is separated or disconnected from the sense amplifier 431 while precharging the selected bit line.

The first decoder circuit 410 may additionally includes capacitors C11, C12, and C12 connected to the word line WL1 and capacitors C21, C22, and C23 connected to the word line WL2.

Hereinafter, a read operation of the memory device 400 will be described with reference to FIGS. 9 to 12. In an exemplary embodiment described with reference to FIGS. 9 to 12, the first word line WL1 and the first bit line BL1 are a selected word line and a selected bit line, respectively. In addition, the second word line WL2 is an unselected word line and is an adjacent word line adjacent to the first word line WL1 that is the selected word line.

Figure 9:
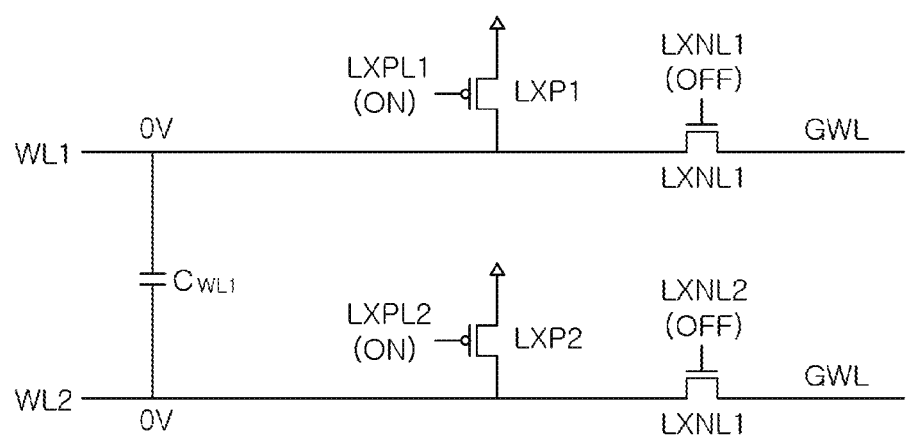

Referring to FIG. 9, in a standby mode, the first selection switching device LXN1 is turned off in response to a first word line selection control signal LXNL1. The first non-selection switching device LXP1 is turned on in response to the first word line non-selection control signal LXPL1. Therefore, the first word line WL1 receives a ground voltage.

The second selection switching device LXN2 is turned off in response to a second word line selection control signal LXNL2. The second non-selection switching device LXP2 is turned on in response to the second word line non-selection control signal LXPL2. Therefore, the second word line WL2 receives a ground voltage.

A capacitance value $CWL_1$ between the first word line WL1 and the second word line WL2 may refer to the capacitance value $CWL_1$ between the first word line WL1 and the second word line WL2, viewed from the first word line WL1.

Figure 10:
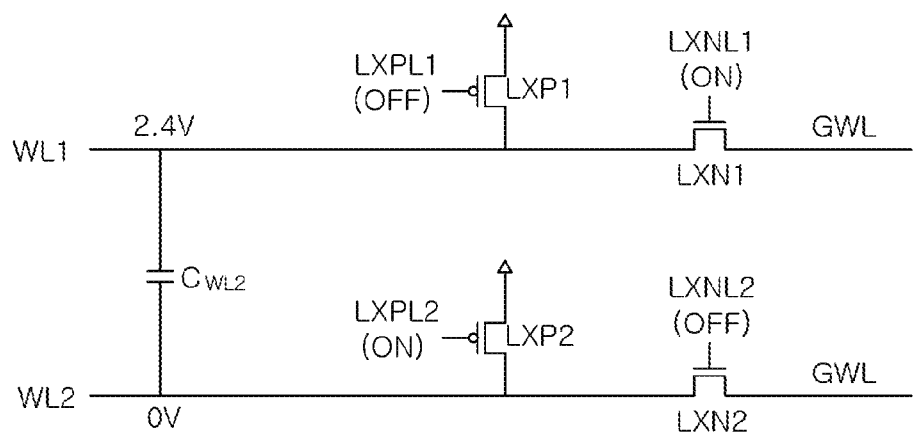

In an example embodiment illustrated in FIG. 10, when a read operation is started on a selected memory cell MC11 connected to the first bit line BL1 and the first word line WL1, the first word line WL1 is precharged.

The first selection switching device LXN1 is turned on in response to the first word line selection control signal LXNL1. The first non-selection switching device LXP1 is turned off in response to the first word line non-selection control signal LXPL1. Therefore, the first word line WL1 is precharged with the first bias voltage.

The second selection switching device LXN2 continues to be turned off, and the second non-selection switching device LXP2 continues to be turned on. Therefore, the ground voltage is input to the second word line WL2.

As the first word line WL1 is precharged from the ground voltage to the first bias voltage, a capacitance value $CWL_2$ between the first word line WL1 and the second word line WL2, viewed from the first word line WL1 to which the selected memory cell MC11 is connected, may increase.

In an exemplary embodiment, when the first word line WL1 is precharged with the first bias voltage, the second decoder circuit 420 turns on an enable device M1 and a clamp device M2 using an enable signal ENB and a clamp voltage VCLAMP. In addition in the exemplary embodiment, the second decoder circuit 420 turns on the common selection switching device GYP shared by the bit lines BL1 to BL4 and turns off the common non-selection switching device GYN. Further in the exemplary embodiment, the second decoder circuit 420 turns on the first selection switching device LYP1 and turns off the first non-selection switching device LYN1, connected to the first bit line BL1. In addition in the exemplary embodiment, the second decoder circuit 420 turns on the non-selection switching devices LYN2 to LYN4 and turns off the selection switching devices LYP2 to LYP4 connected to the second to fourth bit lines BL2 to BL4, respectively. Accordingly, the first bit line BL1 receives a second bias voltage, and the second to fourth bit lines BL2 to BL4 receive a ground voltage.

When the second bias voltage starts to be input to the first bit line BL1, the precharge for the first word line WL1 ends. For example, when the first decoder circuit 410 finishes precharging the first word line WL1, the second decoder circuit 420 inputs the second bias voltage to the first bit line BL1.

In an exemplary embodiment of the inventive concept, before the second bias voltage is input to the first bit line BL1 or at the same time the second bias voltage is being input to the first bit line BL1, the first word line WL1 is floated.

Figure 11:
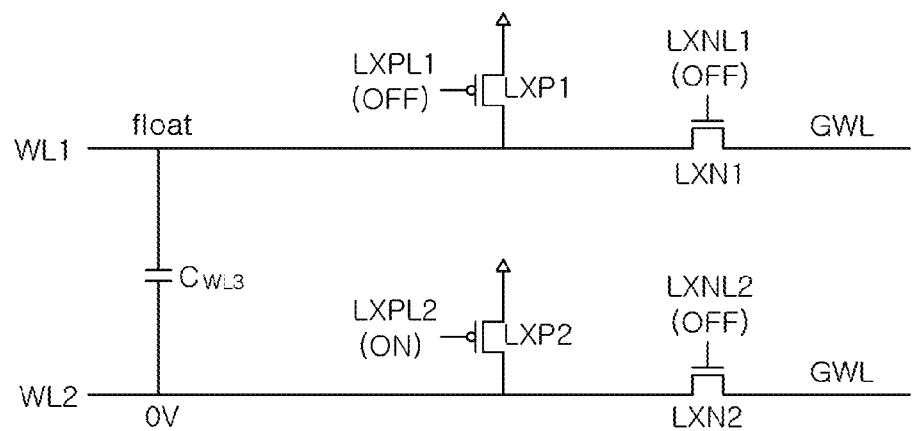

Referring to FIG. 11, after the precharge of the first word line WL1 has completed, the first selection switching device LXN1 is turned off in response to the first word line selection control signal LXNL1. The first non-selection switching device LXP1 continues to be turned off. Thus, the first word line WL1 is floated. For example, the first word line WL1 may be floated while the first bit line BL1 connected to the selected memory cell MC11 is precharged. The second selection switching device LXN2 continues to be turned off, and the second non-selection switching device LXP2 continues to be turned on.

As the first word line WL1 is floated, a capacitance value $CWL_3$ between the first word line WL1 and the second word line WL2, viewed from the first word line WL1 to which the selected memory cell MC11 is connected, may decrease.

According to an exemplary embodiment, the second word line WL2 is floated while the first bit line BL1 is precharged and the first word line WL1 is floated.

Figure 12:
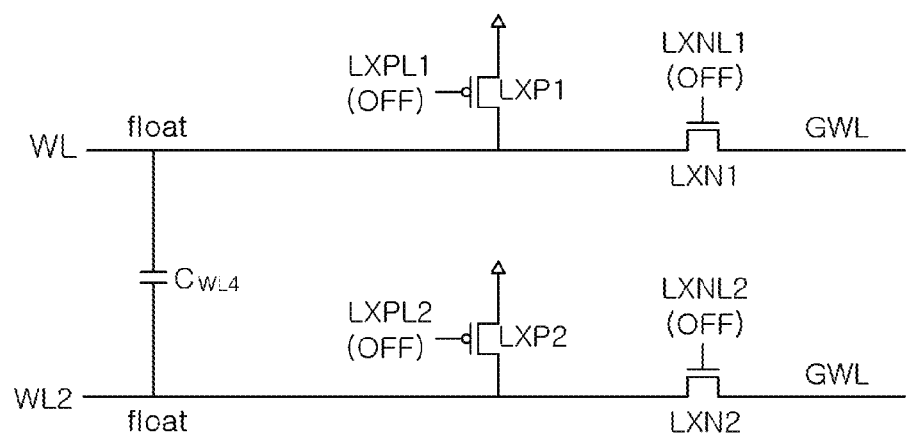

Referring to FIG. 12, while the precharge of the first bit line BL1 is in progress, the second non-selection switching device LXP2 is turned off in response to the second word line non-selection control signal LXPL2. The second selection switching device LXN2 continues to be turned off. Thus, the second word line WL2 may be floated. The first selection switching device LXN1 and the first non-selection switching device LXP1 continue to be turned off.

When the second word line WL2 is floated when the first word line (selected WL) is floated, a capacitance value $CWL_4$ between the first word line WL1 and the second word line WL2, viewed from the first word line WL1 to which the selected memory cell MC11 is connected, may be further reduced. As the capacitance value $CWL_4$ between the first word line WL1 and the second word line WL2 decreases, a read disturb margin may increase. Increasing the read disturb margin may increase the number of reading cycles.

According to an exemplary embodiment, a point in time at which the first word line WL1 is floated and a point in time at which the second word line WL2 is floated are controlled differently. In an example, the point in time at which the second word line WL2 is floated is later than the point in time at which the first word line WL1 is floated. Therefore, a sensing margin of a memory cell having a relatively low threshold voltage may be prevented from decreasing.

Figure 13:
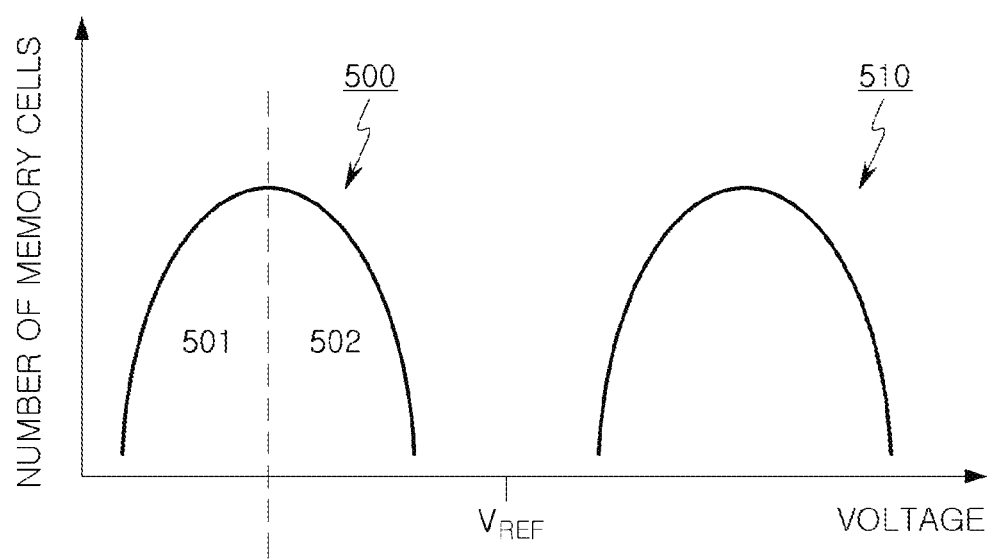
FIGS. 13 to 15 are graphs illustrating a read operation of a memory device according to an exemplary embodiment of the inventive concept.
Figure 14:
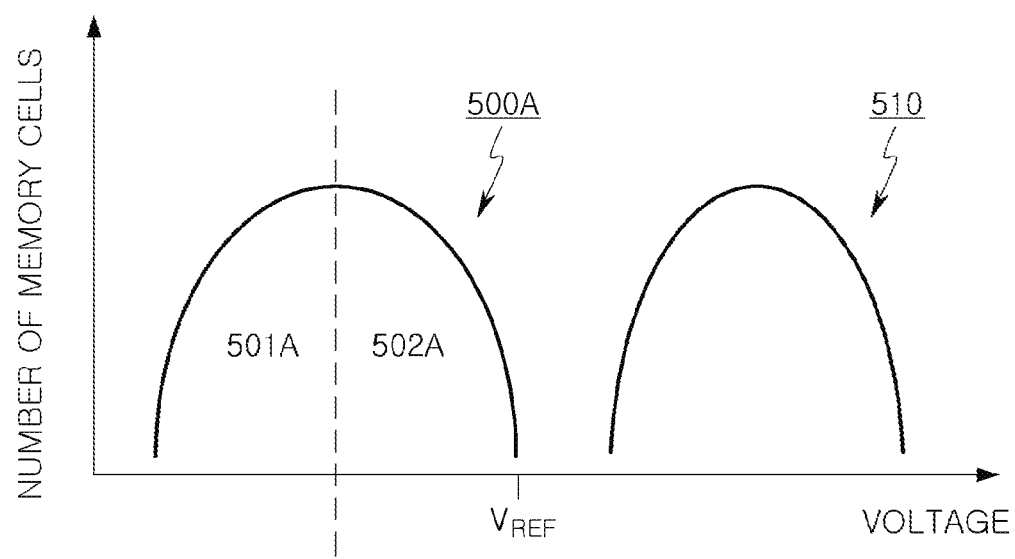
Figure 15:
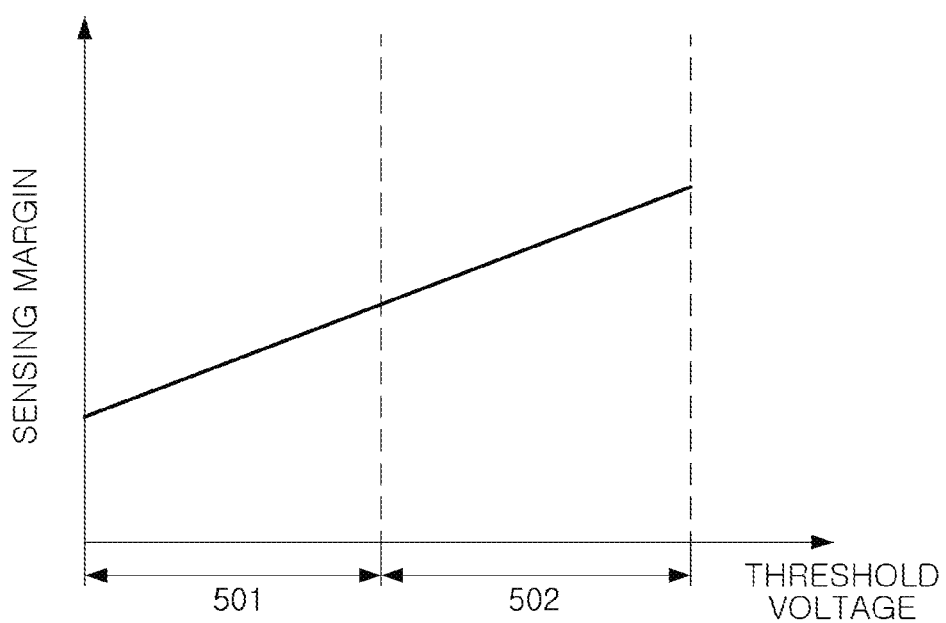

FIGS. 13 to 15 are graphs illustrating a read operation of a memory device according to an exemplary embodiment of the inventive concept.

First, referring to FIG. 13, threshold voltage distributions of memory cells may be distinguished depending on states of information storage devices included in the memory cells. A set state distribution 500 corresponding to a threshold voltage of a memory cell having the set state may be lower than a reset state distribution 510 corresponding to a threshold voltage of a memory cell having the reset state. In an exemplary embodiment, a reference voltage $V_{REF}$ is set to a value larger than that of the set state distribution 500 and smaller than the reset state distribution 510, and the sense amplifier 431 of the memory controller may determine data of the selected memory cell MC11 by comparing a voltage detected from the selected memory cell MC11 among the memory cells with the reference voltage $V_{REF}$.

The set state distribution 500 may be divided into a first region 501 and a second region 502. A memory cell of which a threshold voltage belongs to the first region 501 may have a relatively small sensing margin, but may have a large read disturb margin. A memory cell of which a threshold voltage belongs to the second region 502 may have a relatively large sensing margin and a relatively small read disturb margin.

FIG. 14 is a graph illustrating a change in threshold voltage according to read disturb that may appear in a read operation. Referring to FIG. 13, the threshold voltage of the selected memory cell MC11 having the set state is increased by the read disturb, so that the set state distribution 500A may move to the right. In this case, the influence of the increase in the threshold voltage may be relatively greater in the second region 502A than in the first region 501A. For example, when the threshold voltage of the selected memory cell MC11 is included in the second region 502A, the threshold voltage may increase to the reference voltage $V_{REF}$ by the read disturb, and the selected memory cell MC11 may be evaluated as having a relatively small read disturb margin. In contrast thereto, when the threshold voltage of the selected memory cell MC11 is included in the first region 501A, a difference between the threshold voltage and the reference voltage $V_{REF}$ is maintained at a predetermined level or more even when a read disturb occurs, and thus, the selected memory cell MC11 may be evaluated as having a relatively large read disturb margin.

FIG. 15 is a graph illustrating an exemplary sensing margin of a memory cell having a set state. Referring to FIG. 15 along with FIG. 13, a memory cell having a threshold voltage belonging to the first region 501 of the set state distribution 500 may have a relatively small sensing margin. A memory cell having a threshold voltage belonging to the second region 502 may have a relatively large sensing margin.

As described with reference to FIGS. 13 to 15, a memory cell having a relatively low threshold voltage may have a relatively large read disturb margin, and a memory cell having a relatively high threshold voltage may have a relatively large sensing margin.

By floating an adjacent word line during the time when the selected word line is floated, a capacitance value between the selected word line and the adjacent word line, viewed in the selected word line, may be reduced. Therefore, the read disturb margin of the memory cell having a relatively high threshold voltage may increase. However, a sensing margin of the memory cell having a relatively low threshold voltage may be further reduced.

In an exemplary embodiment of the present inventive concept, a point in time at which the selected word line is floated and a point in time at which the adjacent word line is floated are controlled differently. As an example, the point in time at which the adjacent word line is floated is later than the point in time at which the selected word line is floated. Therefore, the sensing margin of the memory cell having a relatively low threshold voltage may be prevented from decreasing.

FIGS. 16 to 20 are timing diagrams illustrating a read operation of a memory device according to an exemplary embodiment of the inventive concept. Hereinafter, a read operation according to an exemplary embodiment will be described by additionally referring to FIG. 8, for convenience of description.

Figure 16:
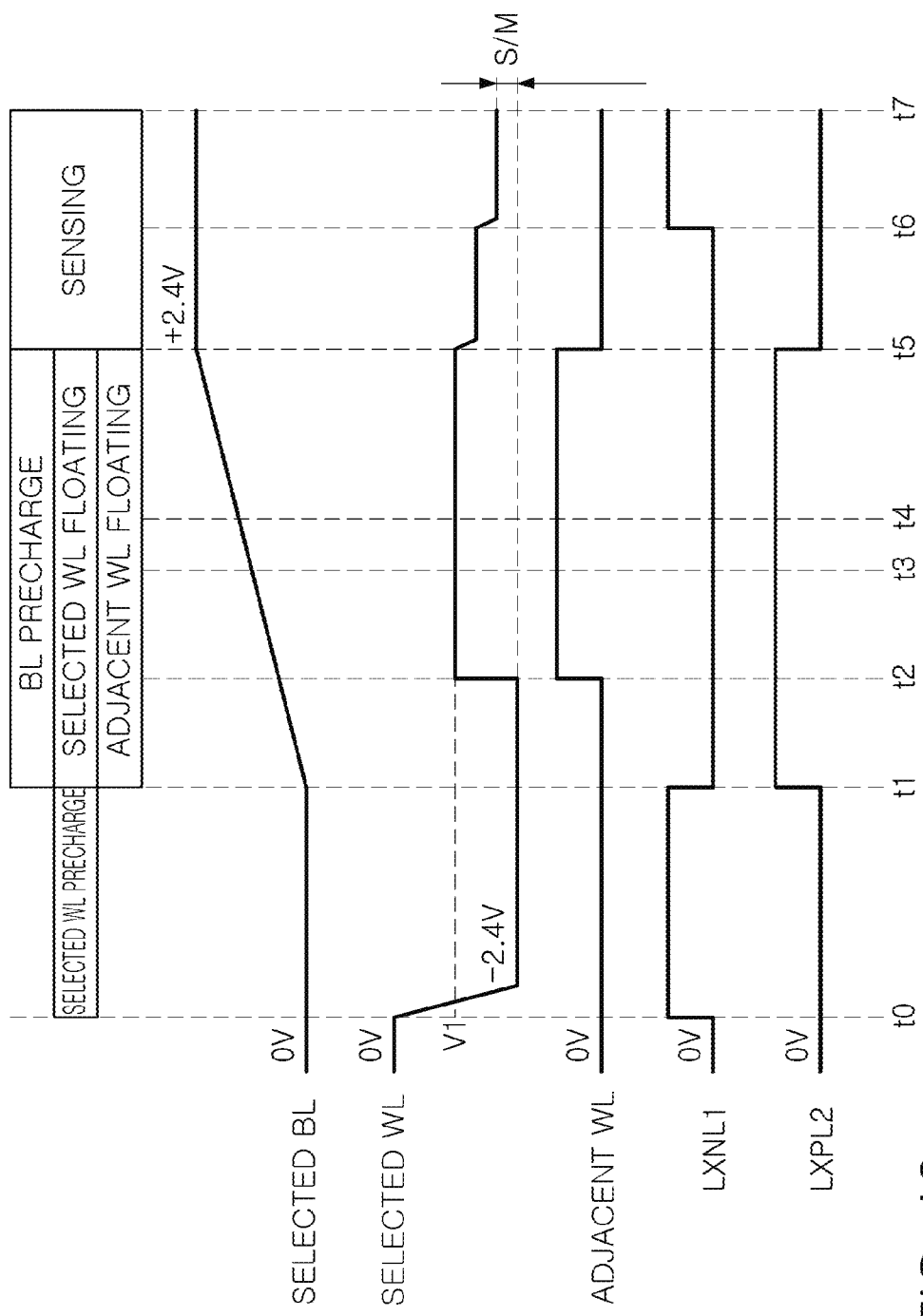
FIGS. 16 to 20 are timing diagrams illustrating a read operation of a memory device according to an exemplary embodiment of the inventive concept.

Referring to FIGS. 8 and 16, during a selected word line precharge time t0-t1 (e.g., a word line precharge period), the first selection switching device LXN1 is turned on in response to the first word line selection control signal LXNL1. The first non-selection switching device LXP1 is turned off in response to the first word line non-selection control signal LXPL1. Thus, the selected word line (SELECTED WL) may be precharged with a first bias voltage, for example, −2.4V.

The second selection switching device LXN2 is turned off in response to the second word line selection control signal LXNL2. The second non-selection switching device LXP2 is turned on in response to the second word line non-selection control signal LXPL2. Therefore, the ground voltage is input to the adjacent word line (ADJACENT WL).

During a bit line precharge time t1-t5 (e.g., a bit line precharge period) after the selected word line precharge time t0-t1, a second bias voltage of, for example, 2.4V, is input to the selected bit line (SELECTED BL) connected to the selected memory cell. Thus, the selected bit line is precharged with the second bias voltage, for example, 2.4V.

During the bit line precharge time t1-t5, the first selection switching device LXN1 is turned off in response to the first word line selection control signal LXNL1. The first non-selection switching device LXP1 continues to be turned off. Thus, the selected word line is floated. For example, the selected word line may be floated while the selected bit line (selected BL) connected to the selected memory cell MC11 is precharged.

During the bit line precharge time t1-t5, the second selection switching device LXN2 is turned off in response to the second word line selection control signal LXNL2. The second non-selection switching device LXP2 is turned off in response to the second word line non-selection control signal LXPL2. Thus, the adjacent word line is floated. For example, the adjacent word line may be floated while the selected bit line connected to the selected memory cell MC11 is precharged.

During the bit line precharge time t1-t5, a voltage between the selected word line and the selected bit line (selected BL) may increase. When the voltage across the selected memory cell MC11 increases to the first threshold voltage as the voltage between the selected word line and the selected bit line increases, the selected memory cell MC11 may be turned on. As an example, the first threshold voltage may refer to a voltage at a point in time at which the selected memory cell MC11 is turned on. For example, in a case in which the threshold voltage of the selected memory cell MC11 is relatively low, the selected memory cell MC11 may be turned on at time t2.

When the selected memory cell MC11 is turned on, the voltage across the selected memory cell MC11 may decrease due to a sensing current flowing through the selected memory cell. When the voltage across the selected memory cell MC11 decreases to a second threshold voltage, the selected memory cell MC11 may be turned off. For example, the second threshold voltage may refer to a voltage at a point in time at which the selected memory cell is turned off from a turned-on state. In this case, the voltage of the selected word line may be V1(=Vth−Vs). In an exemplary embodiment, V1 is a voltage greater than the first bias voltage and less than the ground voltage.

When the voltage of the selected word line increases to V1, the adjacent word line may be in a floating state. Therefore, a coupling effect may occur due to the capacitance between the selected word line and the adjacent word line, viewed from the selected word line. Due to the coupling effect, at time t2, the voltage of the adjacent word line may increase together as the voltage of the selected word line increases.

During a sensing time t5-t7 (e.g., a sensing period), the sense amplifier 431 determines the data of the selected memory cell MC11 by comparing the voltage detected from the selected memory cell MC11 with the reference voltage $V_{REF}$. At time t5, the second non-selection switching device LXP2 is turned on in response to the second word line non-selection control signal LXPL2. When the second non-selection switching device LXP2 is turned on, 0V may be input to the adjacent word line. When the second non-selection switching device LXP2 is turned on, the selected word line is in a floating state. Therefore, the coupling effect may occur due to the capacitance between the selected word line and the adjacent word line. Due to the coupling effect, at time t5, the voltage of the selected word line may decrease together as the voltage of the adjacent word line decreases.

At time t6, the first selection switching device LXN1 is turned on in response to the first word line selection control signal LXNL1. When the first selection switching device LXN1 is turned on, charge sharing may occur between the selected word line and a global word line. For example, a voltage of the global word line may be precharged to −2.4 V, and a voltage of the selected word line may be V1. Due to the charge sharing, the voltage of the selected word line may decrease.

As described with reference to FIG. 16, in the case in which the adjacent word line is floated at a point in time at which a memory cell having a relatively low threshold voltage is turned on, the voltage across the selected memory cell may decrease twice during a sensing time t5-t7. Accordingly, since a sensing margin S/M may be further reduced, the state of the selected memory cell MC11 may be incorrectly determined as a reset state, rather than a set state.

Figure 17:
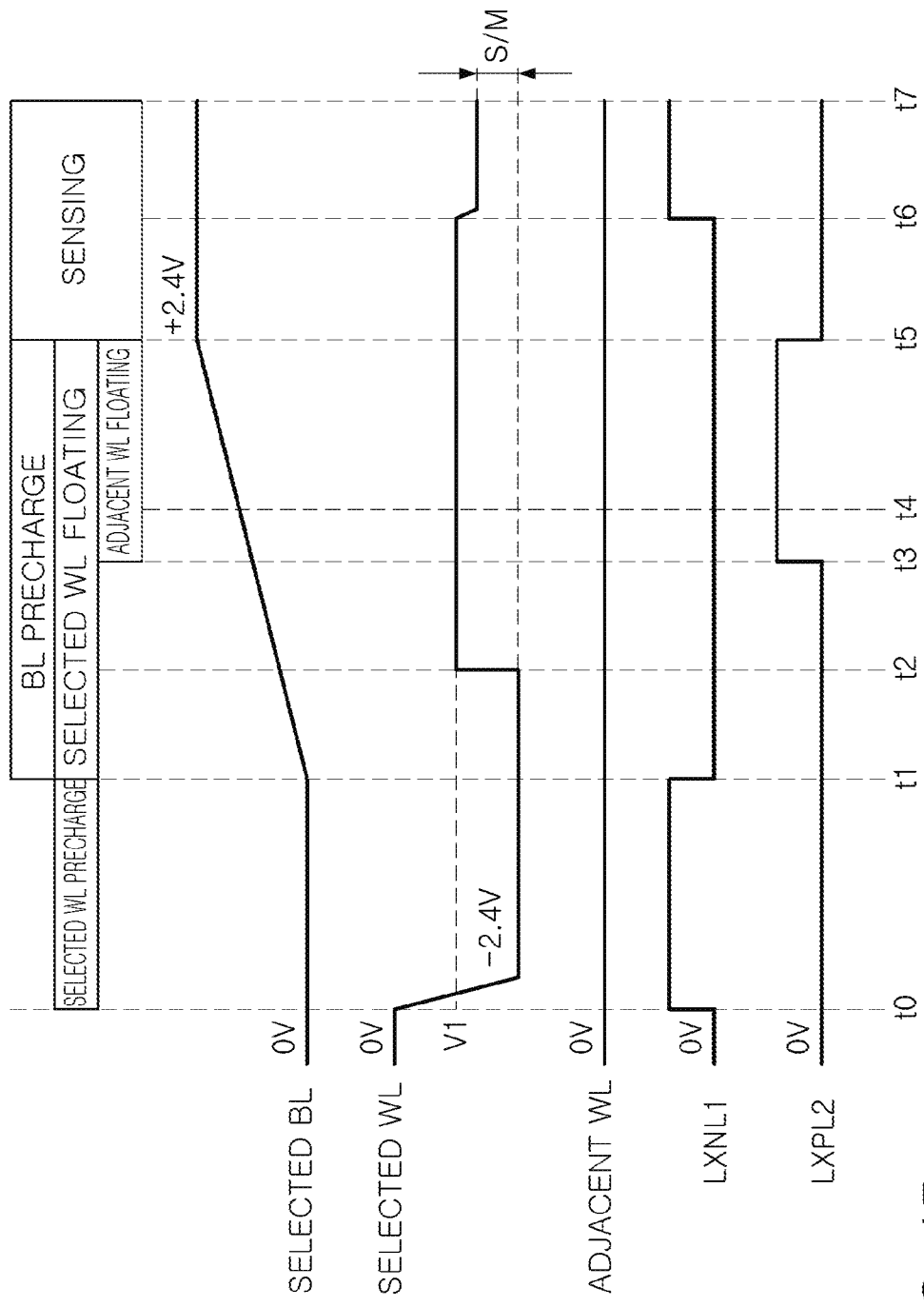

Referring to FIGS. 8 and 17, differently from the case of FIG. 16, in a bit line precharge time t1-t5, the time t1-t5 for which the selected word line is floated includes the time t3-t5 during which the adjacent word line is floated, and the time t3-t5 during which the adjacent word line is floated is shorter than the time t1-t5 during which the selected word line is floated.

For example, during the bit line precharge time t1-t5, the first selection switching device LXN1 is turned off in response to the first word line selection control signal LXNL1. The first non-selection switching device LXP1 continues to be turned off. Thus, the selected word line is floated.

During the first bit line precharge time t1 to t3, the second selection switching device LXN2 is turned off in response to the second word line selection control signal LXNL2. The second non-selection switching device LXP2 is turned on in response to the second word line non-selection control signal LXPL2. Therefore, the adjacent word line is not floated and receives a ground voltage.

During the second bit line precharge time t3-t5, the second selection switching device LXN2 continues to be turned off. The second non-selection switching device LXP2 is turned off in response to the second word line non-selection control signal LXPL2. Thus, the adjacent word line is floated. For example, the adjacent word line is only floated for part (t3-t5) of a period (t1-t5) during which the selected word line is floated. For example, the selected word line is floated through the period and the adjacent word line is floated for a remaining part of the period.

In a case in which the threshold voltage of the selected memory cell MC11 is relatively low, the selected memory cell MC11 may be turned on at time t2. When the voltage of the selected word line increases to V1, the adjacent word line is not floating. Since the adjacent word line is not in a floating state, a coupling effect does not occur between the selected word line and the adjacent word line. Therefore, the voltage of the adjacent word line may continue to maintain 0V.

At time t5, the second non-selection switching device LXP2 switches from a turn-off state to a turn-on state in response to the second word line non-selection control signal LXPL2. When the second non-selection switching device LXP2 is turned on, a ground voltage is applied to the adjacent word line. When the second non-selection switching device LXP2 is turned on, the selected word line may be in a floating state. However, since the voltage of the adjacent word line is maintained at 0V, the voltage of the selected word line may be maintained at V1.

At time t6, the first selection switching device LXN1 is turned on in response to the first word line selection control signal LXNL1. When the first selection switching device LXN1 is turned on, charge sharing may occur between the selected word line and the global word line. For example, the voltage of the global word line may be precharged to −2.4 V, and the voltage of the selected word line may be V1. Due to the charge sharing, the voltage of the selected word line may decrease.

As described with reference to FIG. 17, the adjacent word line is not floated at a point at which a memory cell having a relatively low threshold voltage is turned on. In this case, the voltage across the selected memory cell may decrease once during the sensing time t5-t7. Therefore, a sensing margin S/M of FIG. 17 may be larger than a sensing margin S/M of FIG. 16. Since the sensing margin S/M may be sufficiently secured, the state of the selected memory cell MC11 may be accurately determined as the set state.

Figure 18:
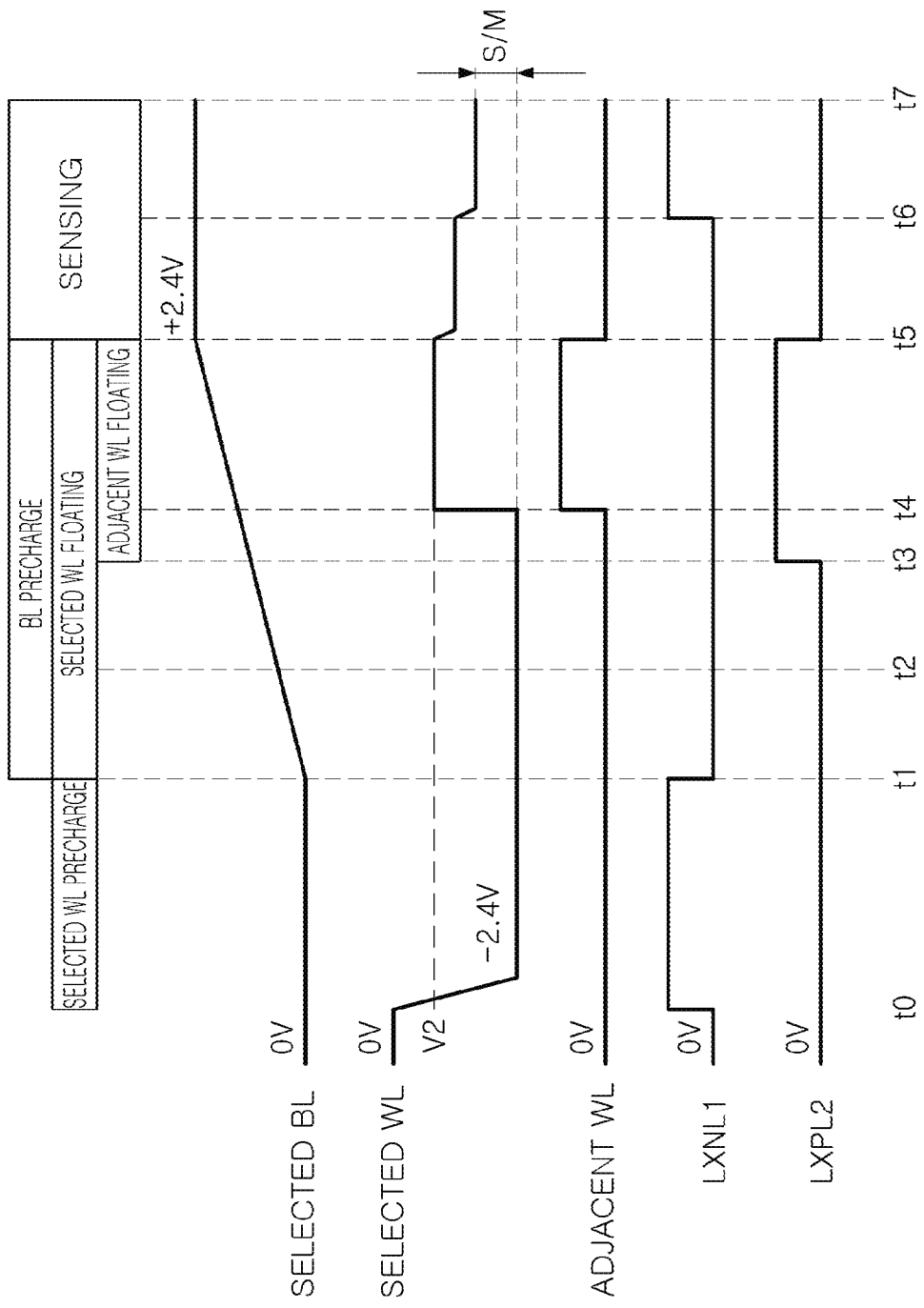

FIG. 18 will be described based on differences in comparison with FIG. 17. Referring to FIGS. 8 and 18, unlike FIG. 17, FIG. 18 illustrates that the threshold voltage of the selected memory cell MC11 may be relatively high. Therefore, the selected memory cell MC11 may be turned on after the adjacent word line is floated.

The voltage of the selected word line increases to V2 while the adjacent word line is floated during the bit line precharge time t1-t5. The voltage V2 of the selected word line when the threshold voltage of the selected memory cell MC11 is relatively high may be greater than the voltage V1 of the selected word line when the threshold voltage of the selected memory cell MC11 is relatively low.

When the voltage of the selected word line increases, the adjacent word line is in a floating state, and thus, a coupling effect may occur between the selected word line and the adjacent word line. Due to the coupling effect, the voltage of the adjacent word line may increase together as the voltage of the selected word line increases.

As the adjacent word line is floated, a capacitance value between the selected word line and the adjacent word line, viewed from the selected word line, may decrease. When the capacitance value between the selected word line and the adjacent word line decreases, the read disturb margin may increase. Increasing the read disturb margin may increase the number of reading cycles.

At time t5, the second non-selection switching device LXP2 is turned on in response to the second word line non-selection control signal LXPL2. When the second non-selection switching device LXP2 is turned on, 0 V may be input to the adjacent word line. When the second non-selection switching device LXP2 is turned on, the selected word line is in a floating state. Therefore, the coupling effect may occur due to the capacitance between the selected word line and the adjacent word line. Due to the coupling effect, at time t5, the voltage of the selected word line may decrease together as the voltage of the adjacent word line decreases.

At time t6, the first selection switching device LXN1 is turned on in response to the first word line selection control signal LXNL1. When the first selection switching device LXN1 is turned on, charge sharing may occur between the selected word line and a global word line. For example, the voltage of the global word line may be precharged to −2.4 V, and the voltage of the selected word line may be V2. Due to the charge sharing, the voltage of the selected word line may decrease.

In an exemplary embodiment, the voltage V2 of the selected word line when the threshold voltage of the selected memory cell MC11 is relatively high is greater than the voltage V1 of the selected word line when the threshold voltage of the selected memory cell MC11 is relatively low. Therefore, even when the voltage across the selected memory cell MC11 decreases twice, the sensing margin may be sufficiently secured.

Figure 19:
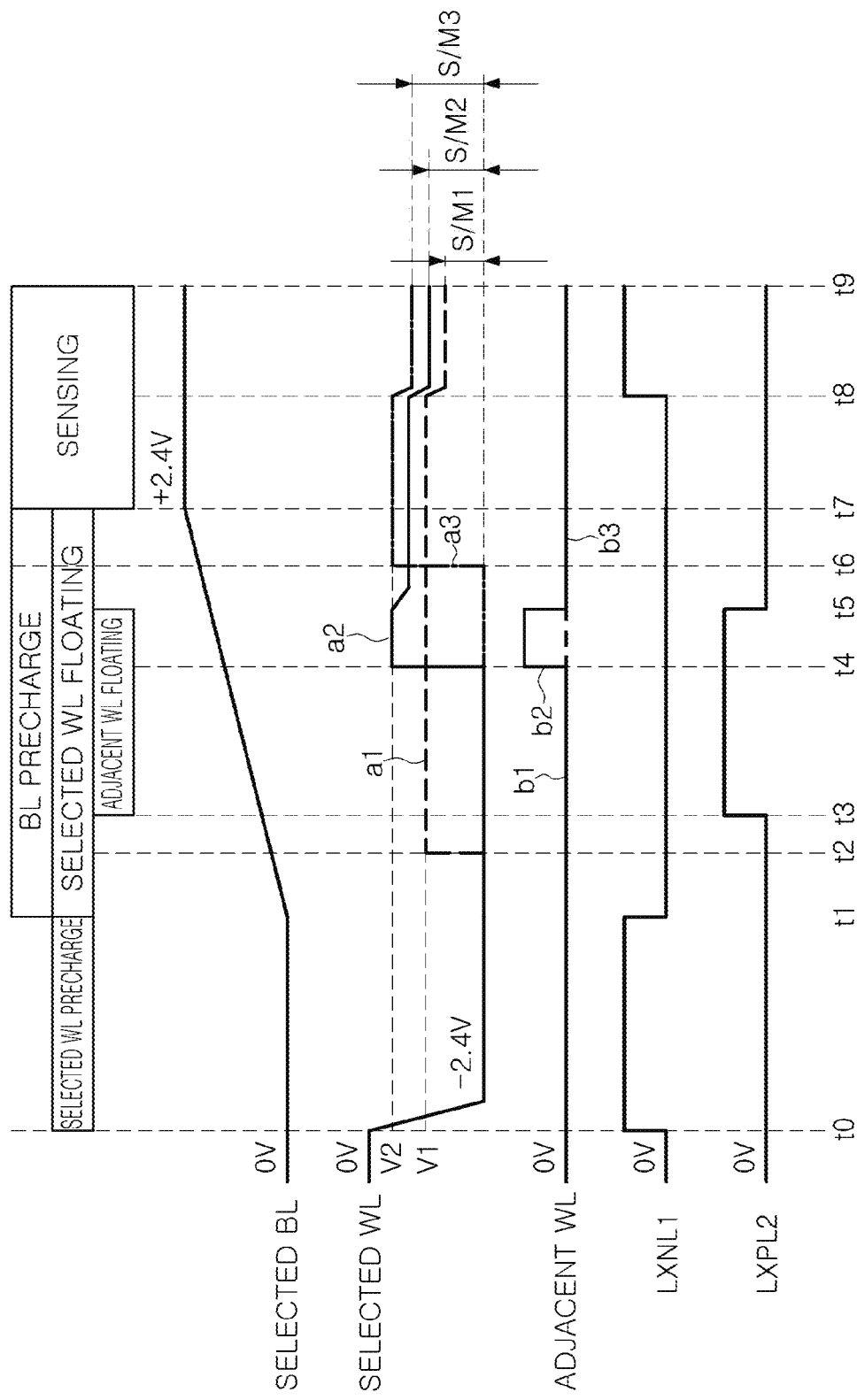

Referring to FIGS. 8 and 19, the time t3-t5 when the adjacent word line is floated in FIG. 19 is different from the time t3-t5 when the adjacent word line is floated in FIG. 18. For example, the first selection switching device LXN1 is first turned off in response to the first word line selection control signal LXNL1. Thereafter, the second non-selection switching device LXP2 is turned off in response to the second word line non-selection control signal LXPL2. The second non-selection switching device LXP2 is turned on in response to the second word line non-selection control signal LXPL2 at time t5 before the bit line precharge time expires. For example, the adjacent word line may be floated only during a middle period (t3-t5) of the period (t1-t7) during which the selected word line is floated. For example, the selected word line may be floated for a first period (t1-t3), then the selected word line may continue to be floated and the adjacent word line may be floated for a second period (t3-t5), and then the selected word line may continue to be floated while the adjacent word line is no longer floated during a third period (t5-t7).

In FIG. 19, a case in which the selected memory cell MC11 is turned on before the adjacent word line is floated, a case in which the selected memory cell MC11 is turned on in a state in which the adjacent word line is floated, and a case in which the selected memory cell MC11 is turned on when the adjacent word line is not in the floating state after the adjacent word line is floated, will be described.

For example, when the selected memory cell MC11 is turned on before the adjacent word line is floated, the threshold voltage of the selected memory cell MC11 may be relatively low. When the voltage of a selected word line a1 increases to V1, since an adjacent word line b1 is not in a floating state, a coupling effect does not occur between the selected word line a1 and the adjacent word line b1. Accordingly, the voltage of the adjacent word line b1 may continue to be 0V.

At time t3, the second non-selection switching device LXP2 is turned off in response to the second word line non-selection control signal LXPL2. Since the second non-selection switching device LXP2 is turned off, the adjacent word line b1 is in a floating state. However, since the voltage of the selected word line a1 is maintained at V1, the voltage of the adjacent word line b1 may also be maintained at 0V.

At time t5, the second non-selection switching device LXP2 is turned on in response to the second word line non-selection control signal LXPL2. Since the second non-selection switching device LXP2 is turned on, a ground voltage is input to the adjacent word line b1. Since the voltage of the adjacent word line b1 is maintained at 0 V, the voltage of the selected word line a1 may be maintained at V1.

At time t7, the second non-selection switching device LXP2 continues to be turned on. At time t7, the selected word line may be in a floating state, but since the voltage of the adjacent word line is maintained at 0V, the voltage of the selected word line may also be maintained at V1.

At time t8, the first selection switching device LXN1 is turned on in response to the first word line selection control signal LXNL1. When the first selection switching device LXN1 is turned on, charge sharing may occur between the selected word line and a global word line. For example, the voltage of the global word line may be precharged to −2.4 V, and the voltage of the selected word line may be V1. Due to the charge sharing, the voltage of the selected word line may decrease, thereby obtaining a first sensing margin S/M1.

When the selected memory cell MC11 is turned on in a state in which the adjacent word line is floated, the threshold voltage of the selected memory cell MC11 may be relatively high. The selected memory cell MC11 is turned on, and thus, the voltage of a selected word line a2 may increase to V2. When the voltage of the selected word line a2 increases, an adjacent word line b2 is in a floating state, and thus, the coupling effect may occur between the selected word line a2 and the adjacent word line b2. Therefore, as the voltage of the selected word line a2 increases, the voltage of the adjacent word line b2 may also increase together.

At time t5, the second non-selection switching device LXP2 is turned on in response to the second word line non-selection control signal LXPL2. Since the second non-selection switching device LXP2 is turned on, a ground voltage is input to the adjacent word line b1. When the second non-selection switching device LXP2 is turned on, the selected word line a2 is in a floating state. Therefore, since the voltage of the adjacent word line b2 is reduced to 0V, the voltage of the selected word line a2 may also decrease.

At time t7, the second non-selection switching device LXP2 continues to be turned on. At time t7, the selected word line a2 may be in a floating state, but since the voltage of the adjacent word line b2 is maintained at 0V, the voltage of the selected word line may also be maintained.

At time t8, the first selection switching device LXN1 is turned on in response to the first word line selection control signal LXNL1. When the first selection switching device LXN1 is turned on, charge sharing may occur between the selected word line a2 and the global word line. Due to the charge sharing, the voltage of the selected word line a2 may be reduced, thereby obtaining a second sensing margin S/M2 greater than the first sensing margin S/M1.

For example, in a case in which the selected memory cell MC11 is turned on when the adjacent word line is not in the floating state after being floated, the threshold voltage of the selected memory cell MC11 may be relatively high. The selected memory cell MC11 is turned on, and the voltage of a selected word line a3 may increase to V2. When the voltage of the selected word line a3 increases, an adjacent word line b3 is not in a floating state, and thus, a coupling effect does not occur between the selected word line a3 and the adjacent word line b3. Therefore, the voltage of the adjacent word line b3 may continue to be maintained at 0V.

At time t7, the second non-selection switching device LXP2 continues to be turned on. At time t7, the selected word line a2 may be in a floating state, but since the voltage of the adjacent word line b2 is maintained at 0V, the voltage of the selected word line may also be maintained.

At time t8, the first selection switching device LXN1 is turned on in response to the first word line selection control signal LXNL1. When the first selection switching device LXN1 is turned on, charge sharing may occur between the selected word line a2 and the global word line. Due to the charge sharing, the voltage of the selected word line a2 may be reduced, thereby obtaining a third sensing margin S/M3 greater than the second sensing margin S/M2.

Figure 20:
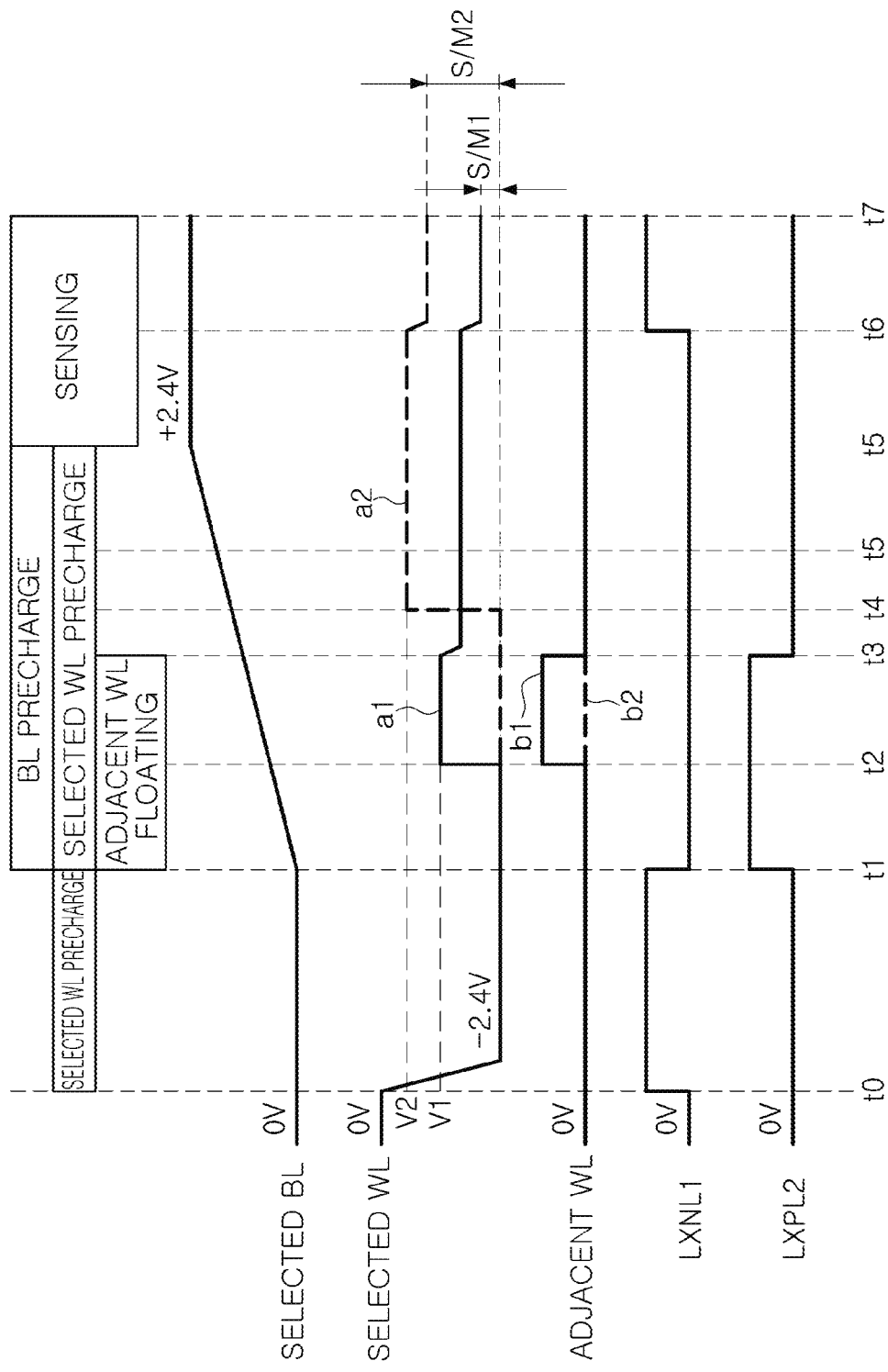

Referring to FIGS. 8 and 20, the time t1-t3 during which the adjacent word line is floated in FIG. 20 is different from the time t3-t5 for which the adjacent word line is floated in FIG. 18.

For example, at time t1, the first selection switching device LXN1 is turned off in response to the first word line selection control signal LXNL1. At time t1, the second non-selection switching device LXP2 is turned off in response to the second word line non-selection control signal LXPL2. The second non-selection switching device LXP2 is turned on in response to the second word line non-selection control signal LXPL2 at time t3 before the bit line precharge time expires.

With reference to FIG. 20, a case in which the selected memory cell MC11 is turned on in a state in which the adjacent word line is floated, and a case in which the selected memory cell MC11 is turned on when the adjacent word line is not in a floating state after being floated, will be described.

For example, when the selected memory cell MC11 is turned on in the state in which the adjacent word line is floated, the threshold voltage of the selected memory cell MC11 may be relatively low. When the voltage of the selected word line a1 increases to V1, a coupling effect may occur between the selected word line a2 and the adjacent word line b2 since the adjacent word line b1 is in a floating state. Therefore, as the voltage of the selected word line a2 increases, the voltage of the adjacent word line b2 may also increase.

At time t3, the second non-selection switching device LXP2 is turned on in response to the second word line non-selection control signal LXPL2. Since the second non-selection switching device LXP2 is turned on, the ground voltage is input to the adjacent word line b1. When the second non-selection switching device LXP2 is turned on, the selected word line a2 is in a floating state. Therefore, as the voltage of the adjacent word line b2 is reduced to 0V, the voltage of the selected word line a2 may also decrease.

At time t5, the second non-selection switching device LXP2 remains turned on. At time t5, the selected word line a2 may be in a floating state, but since the voltage of the adjacent word line b2 is maintained at 0V, the voltage of the selected word line may also be maintained.

At time t6, the first selection switching device LXN1 is turned on in response to the first word line selection control signal LXNL1. When the first selection switching device LXN1 is turned on, charge sharing may occur between the selected word line a2 and the global word line. Due to the charge sharing, the voltage of the selected word line a2 may be reduced, thereby obtaining a first sensing margin S/M1.

In the case in which the selected memory cell MC11 is turned on when the adjacent word line is not in the floating state after being floated, the threshold voltage of the selected memory cell MC11 may be relatively high. The selected memory cell MC11 is turned on, and the voltage of the selected word line a3 may increase to V2. When the voltage of the selected word line a3 increases, the adjacent word line b3 is not in a floating state, and thus, a coupling effect does not occur between the selected word line a3 and the adjacent word line b3. Therefore, the voltage of the adjacent word line b3 may be maintained at 0V.

At time t5, the second non-selection switching device LXP2 remains turned on. At time t7, the selected word line a2 may be in a floating state, but since the voltage of the adjacent word line b2 is maintained at 0V, the voltage of the selected word line may also be maintained.

At time t6, the first selection switching device LXN1 is turned on in response to the first word line selection control signal LXNL1. When the first selection switching device LXN1 is turned on, charge sharing may occur between the selected word line a2 and the global word line. Due to the charge sharing, the voltage of the selected word line a2 may be reduced, thereby obtaining the second sensing margin S/M2 greater than the first sensing margin S/M1.

In an exemplary embodiment, the selected word line is in a floating state during a bit line precharging period and a sensing period. Thus, data of the selected memory cell may be read while the current does not flow to the selected word line and the selected word line is floated.

For example, the adjacent word line may be floated only during a first period (t1-t3) of the period (t1-t5) during which the selected word line is floated. For example, the selected word line and the adjacent word line may be floated for the first period (t1-t3), and then the selected word line may continue to be floated while the adjacent word line is no longer floated during a second period (t3-t5).

Figure 21:
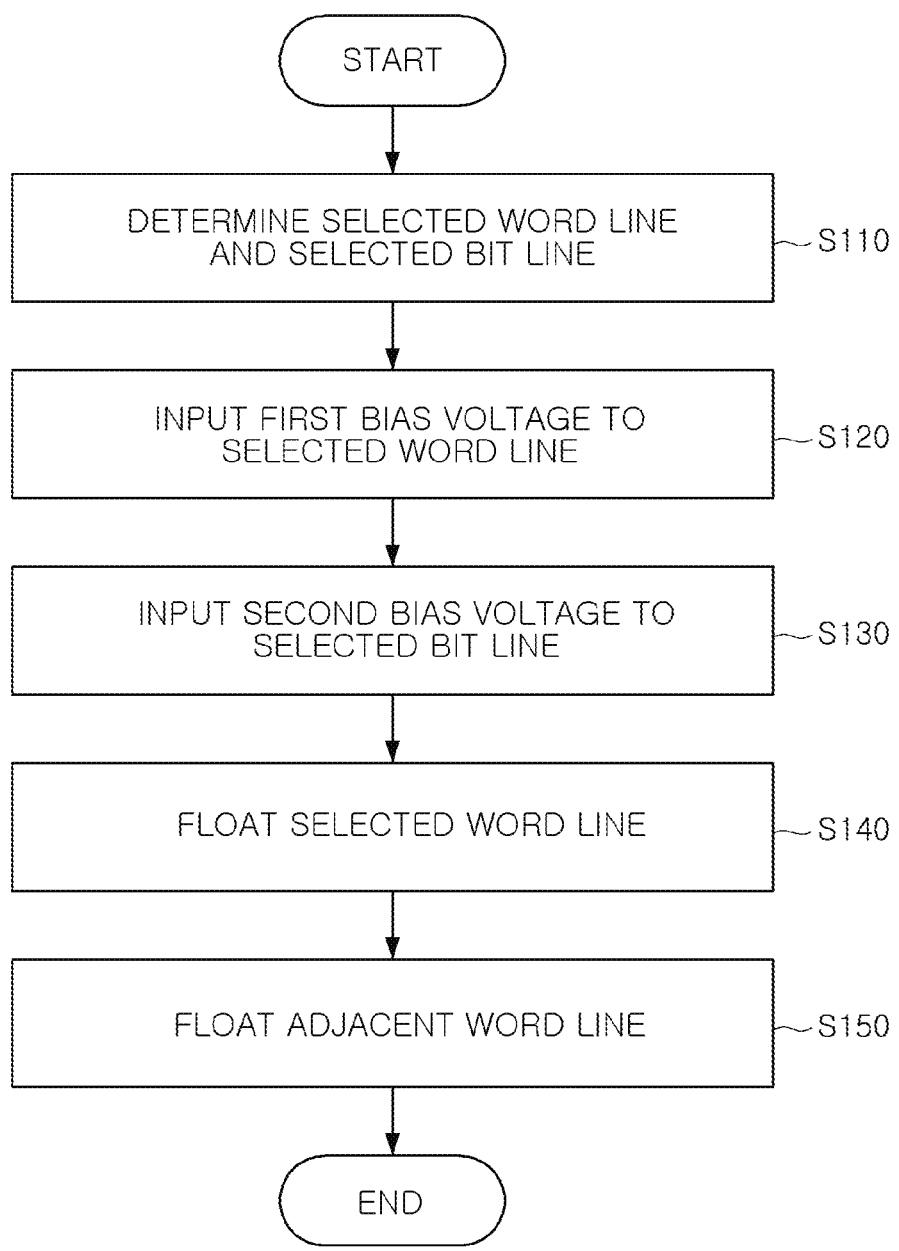
FIG. 21 is a flowchart illustrating a read operation of a memory device according to an exemplary embodiment of the inventive concept.

FIG. 21 is a flowchart illustrating a read operation of a memory device according to an exemplary embodiment of the inventive concept. Referring to FIG. 21, a read operation of a memory device according to an exemplary embodiment is started by determining a selected word line from among a plurality of word lines and determining a selected bit line from among a plurality of bit lines (S110). The selected word line and the selected bit line may be a word line and a bit line connected to a selected memory cell from which data is to be read.

A memory controller inputs a first bias voltage to the selected word line (S120). In an exemplary embodiment, the first bias voltage is a negative voltage. Next, the memory controller inputs a second bias voltage to the selected bit line (S130). In an exemplary embodiment, the second bias voltage is a positive voltage, and absolute values of the first bias voltage and the second bias voltage are equal to each other. In an exemplary embodiment, the second bias voltage is input to the selected bit line after a predetermined period of time elapses after the first bias voltage is input to the selected word line.

Next, the memory controller floats the selected word line (S140). In an exemplary embodiment, the memory controller turns off a first non-selection switching device supplying a ground voltage to the selected word line during a bit line precharge time, and turns off a first selection switching device inputting the first bias voltage to the selected word line, thereby floating the selected word line.

The memory controller floats an adjacent word line (S150). The memory controller may float the adjacent word line adjacent to the selected word line during the bit line precharge time. The time during which the selected word line is floated may include a time during which the adjacent word line is floated. In an exemplary embodiment, the time during which the adjacent word line is floated is shorter than the time during which the selected word line is floated.

Therefore, read disturb of a memory cell having a relatively high threshold voltage may be improved without reducing a sensing margin of the memory cell having a relatively low threshold voltage.

According to an exemplary embodiment of the inventive concept, when the memory cell array 30 of FIG. 2 includes first memory cells connected to a first word line formed in a first layer, and second memory cells connected to a second word line formed in a second layer above the first layer; a point in time at which a first adjacent word line adjacent to the first word line is floated after a point in time at which a bit line precharging period for the first memory cells is started, and a point in time at which a second adjacent word line adjacent to the second word line is floated after a point in time at which a bit line precharging period for the second memory cells is started, are different from each other.

According to an exemplary embodiment of the inventive concept, when the memory cell array 30 of FIG. 2 includes a first memory cell connected to a first word line and a second memory cell connected to a second word line; a point in time at which a first adjacent word line adjacent to the first word line is floated after a point in time at which a bit line precharging period for the first memory cell is started, and a point in time at which a second adjacent word line adjacent to the second word line is floated after a point in time at which a bit line precharging period for the second memory cell is started, is determined depending on a current path of the first memory cell and a current path of the second memory cell. The current path may refer to a distance between the memory cell and a decoder circuit.

For example, a memory cell having a relatively long current path may have a higher path resistance and a smaller read disturbance than a memory cell having a relatively short current path. Accordingly, a floating point of the adjacent word line of the memory cell having a long current path may be delayed behind a floating point of the adjacent word line of the memory cell having a short current path.

Figure 22:
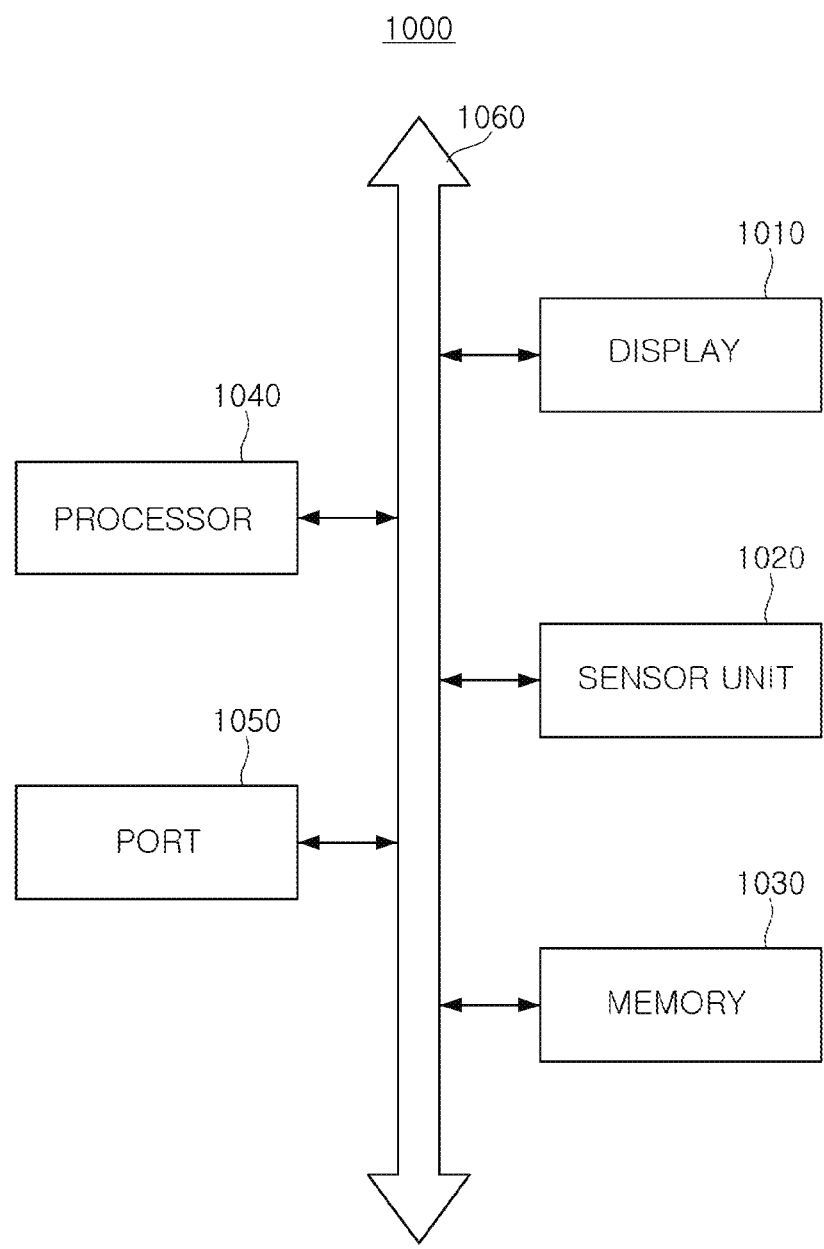
FIG. 22 is a block diagram schematically illustrating an electronic device including a memory device according to an exemplary embodiment of the inventive concept.

FIG. 22 is a block diagram schematically illustrating an electronic device including a memory device according to an exemplary embodiment of the inventive concept.

A computer apparatus 1000 according to the exemplary embodiment illustrated in FIG. 22 includes a display 1010 (e.g., a display device), a sensor unit 1020 (e.g. one or more sensors), a memory 1030, a processor 1040, and a port 1050 (e.g., one or more ports). In addition, the computer apparatus 1000 may further include a wired/wireless communication device (e.g., a modem, a network card, etc.) and a power supply device. Among the components illustrated in FIG. 21, the port 1050 may be a device provided for the computer apparatus 1000 to communicate with a video card, a sound card, a memory card, a universal serial bus (USB) device. The computer apparatus 1000 may be a device encompassing a smartphone, a tablet PC, a smart wearable device, a general desktop computer or a laptop computer.

The processor 1040 may perform a specific operation, an instruction, or a task. The processor 1040 may be a central processing unit (CPU) or a microprocessor unit (MCU) or a system on a chip (SoC), and may communicate with other devices connected to the port 1050, as well as the display 1010, the sensor unit 1020 and the memory 1030 through a bus 1060.

The memory 1030 may be a storage medium that stores data necessary for the operation of the computer apparatus 1000 or multimedia data. The memory 1030 may include a volatile memory such as a random access memory (RAM) or a nonvolatile memory such as a flash memory. The memory 1030 may also include at least one of a solid state drive (SSD), a hard disk drive (HDD), and an optical drive (ODD) as a storage device.

In an exemplary embodiment of the inventive concept, the memory 1030 include a phase change memory device that writes/erases and reads data by using resistance change of a phase change material. In the exemplary embodiment illustrated in FIG. 22, the memory 1030 include a memory device according to various embodiments described above with reference to FIGS. 1 through 21.

As set forth above, according to at least one exemplary embodiment, a point in time at which a selected word line is floated and a point in time at which an adjacent word line is floated may be controlled differently, thereby providing an effect in which a sensing margin of a memory cell having a relatively low threshold voltage may be increased.

In addition, since a read disturb margin of a memory cell having a relatively high threshold voltage may be increased, an effect of increasing the number of reading cycles of a memory device may be provided.

While exemplary embodiments of the inventive concept have been illustrated and described above, it will be apparent to those skilled in the art that various modifications can be made without departing from the scope of the present inventive concept.

What is claimed is:
1. A memory device comprising:
 a plurality of memory cells each including a switching device and a storage device connected to the switching device and having a phase change material, the plurality of memory cells being connected to a plurality of word lines and a plurality of bit lines;
 a decoder circuit comprising:
  a first bias circuit configured to input a first bias voltage to a selected word line of the word lines connected to a selected memory cell of the plurality of memory cells during a read operation of the selected memory cell;
a second bias circuit configured to input a second bias voltage to a selected bit line of the bit lines connected to the selected memory cell during the read operation;
a first selection switching device connected between the first bias circuit and a first node connected to the selected word line;
a first non-selection switching device connected between a ground voltage and the first node;
a second selection switching device connected between the first bias circuit and a second node connected to an adjacent word line of the word lines adjacent to the selected word line; and
a second non-selection switching device connected between the ground voltage and the second node;
control logic configured to sequentially turn off the first selection switching device and the second non-selection switching device while the second bias voltage is input to the selected bit line; and
a sense amplifier configured to compare a voltage of the selected word line with a reference voltage to determine read data of the read operation.

2. The memory device of claim 1, further comprising a common selection switching device connected between the selected word line and the first bias circuit, wherein the first selection switching device is connected between the selected word line and the common selection switching device.

3. The memory device of claim 2, wherein the common selection switching device is shared by two or more word lines of the plurality of word lines.

4. The memory device of claim 2, wherein the control logic turns on the first selection switching device and the common selection switching device to input the first bias voltage to the selected word line before inputting the second bias voltage to the selected word line, where a level of the first bias voltage differs from a level of the second bias voltage.

5. The memory device of claim 1, wherein the first selection switching device and the second non-selection switching device are maintained in a turned-off state after the second non-selection switching device is turned off.

6. The memory device of claim 1, wherein the control logic is configured to turn on the first non-selection switching device to apply a ground voltage to the selected word line and turn on the second non-selection switching device to apply a ground voltage to the adjacent word line, before the first bias voltage is input to the selected word line.

7. The memory device of claim 6, wherein the control logic turns off the second selection switching device during the read operation of the memory device.

8. The memory device of claim 1, wherein the second non-selection switching device is turned on during a sensing period in which the sense amplifier determines the read data.

9. The memory device of claim 8, wherein when the selected memory cell is turned-on before the second non-selection switching device is turned off, a voltage of the selected word line is maintained at a point in time at which the second non-selection switching device is turned-on during the sensing period.

10. The memory device of claim 8, wherein when the selected memory cell is turned-on after the second non-selection switching device is turned off, a voltage of the selected word line decreases when the second non-selection switching device is turned-on during the sensing period.

11. The memory device of claim 8, wherein the first selection switching device is turned on after the second non-selection switching device is turned-on during the sensing period.

12. The memory device of claim 1, wherein the plurality of memory cells comprise a first memory cell and a second memory cell,
wherein one end of the switching device of the first memory cell is connected to a first word line of the word lines, and one end of the storage device of the first memory cell is connected to a first bit line of the bit lines,
wherein one end of the switching device of the second memory cell is connected to a second bit line of the bit lines, and one end of the storage device of the second memory cell is connected to a second word line of the word lines, and
a point in time at which a first adjacent word line of the word lines adjacent to the first word line is floated after a point in time at which a bit line precharging period for the first memory cell starts, and a point in time at which a second adjacent word line of the word lines adjacent to the second word line is floated after a point in time at which a bit line precharging period for the second memory cell starts, are different from each other.

13. The memory device of claim 1, wherein each of the selected word line and the adjacent word line is connected to a selected global word line, and the selected bit line and an adjacent bit line of the bit lines adjacent to the selected bit line are connected to a selected global bit line, and
a capacitance of the selected global word line is lower than capacitance of the selected global bit line while the second bias voltage is input to the selected bit line.

14. The memory device of claim 1, wherein each of the selected word line and the adjacent word line is connected to a selected global word line, and the selected bit line and an adjacent bit line of the bit lines adjacent to the selected bit line are connected to a selected global bit line, and
the selected global word line is disconnected from the sense amplifier while precharging the selected bit line.

15. A memory device comprising:
a memory cell array including a plurality of memory cells respectively disposed at intersections of a plurality of word lines and a plurality of bit lines;
a first decoder circuit configured to determine a selected word line of the word lines connected to a selected memory cell of the plurality of memory cells, the first decoder circuit including a first bias circuit configured to input a first bias voltage to the selected word line during a first period of time;
a second decoder circuit configured to determine a selected bit line of the bit lines connected to the selected memory cell, the second decoder circuit including a second bias circuit configured to input a second bias voltage to the selected bit line during a second period of time, after the first period of time; and
control logic configured to float the selected word line and an adjacent word line of the word lines adjacent the selected word line, during the second period of time,
wherein a point in time at which the selected word line is floated and a point in time at which the adjacent word line is floated are different from each other during the second period of time.

16. The memory device of claim 15, wherein the control logic determines the point in time at which the adjacent word line is floated, based a threshold voltage of the selected memory cell.

17. The memory device of claim 15, wherein the point in time at which the adjacent word line is floated is later than the point in time at which the selected word line is floated.

18. The memory device of claim 15, wherein the memory cell array comprises a first memory cell connected to a first word line of the word lines and a second memory cell connected to a second word line of the word lines,
a point in time at which a first adjacent word line of the word lines adjacent to the first word line is floated after a point in time at which a bit line precharging period for the first memory cell starts, and a point in time at which a second adjacent word line of the word lines adjacent to the second word line is floated after a point in time at which a bit line precharging period for the second memory cell starts, are determined depending on a current path of the first memory cell and a current path of the second memory cell.

19. The memory device of claim 18, wherein when the current path of the first memory cell is longer than the current path of the second memory cell, the point in time at which the first adjacent word line is floated after the point in time at which the bit line precharging period for the first memory cell starts is later than the point in time at which the second adjacent word line is floated after the point in time at which the bit line precharging period of the second memory cell starts.

20. The memory device of claim 15, wherein the memory cell array comprises a first memory cell connected to a first word line of the word lines disposed on a first layer, and a second memory cell connected to a second word line of the word lines disposed on a second layer above the first layer, and
a point in time at which a first adjacent word line of the word lines adjacent to the first word line is floated after a point in time at which a bit line precharging period for the first memory cell starts, and a point in time at which a second adjacent word line of the word lines adjacent to the second word line is floated after a point in time at which a bit line precharging period for the second memory cell starts, are different from each other.

21. A memory device comprising:
a selected memory cell connected to a selected word line and a selected bit line;
a first decoder circuit including a first bias circuit configured to input a first bias voltage to the selected word line during a first period of time; and
a second decoder circuit including a second bias circuit configured to input a second bias voltage to the selected bit line during a second period of time, after the first period of time,
wherein for the second period of time, a period of time in which the selected word line is floated includes a period of time in which an adjacent word line adjacent the selected word line is floated, and the period of time in which the adjacent word line is floated is shorter than the period of time in which the selected word line is floated.

22. The memory device of claim 21, wherein the memory device comprises a first selection switching device connected between the first bias circuit and the selected word line, and a second non-selection switching device connected between the adjacent word line and a ground power supply, and
the control logic floats the selected word line by turning the first selection switching device off and floats the adjacent word line by turning the second non-selection switching device off.

23. The memory device of claim 22, wherein the control logic first turns off the first selection switching device, then turns off the second non-selection switching device, and turns on the second non-selection switching device when the second period of time expires.

24. The memory device of claim 22, wherein the control logic first turns off the first selection switching device, then turns off the second non-selection switching device, and turns on the second non-selection switching device before the second period of time expires.

25. The memory device of claim 21, wherein the selected word line is floated during a sensing time during which a voltage of the selected word line is compared with a reference voltage.

26. A method of operating a memory device, comprising:
inputting a first bias voltage to a selected word line connected to a selected memory cell during a first period of time;
inputting a second bias voltage to a selected bit line connected to the selected memory cell during a second period of time, after the first period of time;
floating the selected word line when the second period of time begins; and
floating an adjacent word line adjacent to the selected word line when the second period of time starts and a predetermined delay time elapses.

27. The method of claim 26, wherein in the floating of the selected word line, a first selection switching device is turned off, and in the floating of the adjacent word line, a second non-selection switching device is turned off,
wherein the first selection switching device is connected between a first bias circuit that outputs a first bias voltage and the selected word line, and the second non-selection switching device is connected between the adjacent word line and a ground power supply, and
wherein the first selection switching device maintains a turned-off state when the predetermined delay time elapses.

28. The method of claim 26, further comprising:
before inputting the first bias voltage to the selected word line, applying a ground voltage to the selected word line by turning on the first non-selection switching device, and applying a ground voltage to the adjacent word line by turning on the second non-selection switching device,
wherein the first non-selection switching device is connected between the first bias circuit outputting the first bias voltage and the selected word line.

29. The method of claim 26, further comprising, after floating the adjacent word line, sequentially turning on the second non-selection switching device and the first selection switching device to compare a voltage of the selected word line with a reference voltage.

30. A method of operating a memory device, comprising:
inputting a first bias voltage to a selected word line connected to a selected memory cell by a first bias circuit for a first period of time;
inputting a second bias voltage to a selected bit line connected to the selected memory cell by a second bias circuit during a second period of time, after the first period of time;
inputting a voltage for turning off a first selection switching device to the first selection switching device connected between the first bias circuit and the selected word line when the second period of time begins; and
inputting a voltage for turning off a second non-selection switching device to the second non-selection switching device connected between a ground power supply and an adjacent word line adjacent to the selected word line when the second period of time starts and a predetermined delay time elapses.

31. The method of claim 30, further comprising inputting a voltage for turning on the second non-selection switching device to the second non-selection switching device at a point in time when the second period of time expires.

32. The method of claim 30, further comprising, before inputting the first bias voltage to the selected word line, inputting a voltage for turning on a first non-selection switching to the first non-selection switching device connected between the first bias circuit and the selected word line, and then inputting a turn-on voltage to the second non-selection switching device.

* * * * *